US012688888B2

(12) United States Patent
Kim

(10) Patent No.: US 12,688,888 B2
(45) Date of Patent: Jul. 21, 2026

(54) NONVOLATILE MEMORY DEVICE, OPERATING METHOD OF NONVOLATILE MEMORY DEVICE, AND MEMORY SYSTEM INCLUDING NONVOLATILE MEMORY DEVICE

(71) Applicant: Samsung Electronics Co., Ltd., Suwon-si (KR)

(72) Inventor: Daeshik Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 137 days.

(21) Appl. No.: 18/898,990

(22) Filed: Sep. 27, 2024

(65) Prior Publication Data

US 2025/0316311 A1     Oct. 9, 2025

(30) Foreign Application Priority Data

Apr. 4, 2024    (KR) ........................ 10-2024-0045905

(51) Int. Cl.
G11C 13/00          (2006.01)

(52) U.S. Cl.
CPC ...... G11C 13/0069 (2013.01); G11C 13/0028 (2013.01); G11C 13/004 (2013.01); *G11C 2013/0054* (2013.01); *G11C 2213/79* (2013.01)

(58) Field of Classification Search
CPC ........... G11C 13/0069; G11C 13/0028; G11C 13/004; G11C 2013/0054; G11C 2213/79
See application file for complete search history.

(56) References Cited

U.S. PATENT DOCUMENTS

| | | | |
|---|---|---|---|
| 3,906,203 | A | 9/1975 | Butulis |
| 7,345,912 | B2 | 3/2008 | Luo et al. |
| 7,570,504 | B2 | 8/2009 | Vo |
| 10,685,951 | B1 | 6/2020 | Gupta et al. |
| 10,854,262 | B2 | 12/2020 | Jung |
| 11,361,812 | B2 | 6/2022 | Chen et al. |
| 2003/0222317 | A1* | 12/2003 | Yoshizawa ............. H10B 10/12 257/E27.099 |

FOREIGN PATENT DOCUMENTS

KR          10-0609555 B1     8/2006

* cited by examiner

*Primary Examiner* — Han Yang
(74) *Attorney, Agent, or Firm* — Muir Patent Law, PLLC

(57)          ABSTRACT

A memory device may include a memory cell array, and a write driver and sense amplifier connected to the memory cell array through bit lines. The memory cell array includes a first cell area including a plurality of first memory cells arranged on a plane corresponding to a first direction and a second direction, a second cell area including a plurality of second memory cells arranged on the plane disposed on one side of the first cell area in the first direction, a word line extending in the first direction and is connected to the plurality of first memory cells and the plurality of second memory cells, first bit lines extending in the second direction and are respectively connected to the plurality of first memory cells, and second bit lines extending in the second direction and are respectively connected to the plurality of second memory cells.

20 Claims, 17 Drawing Sheets

FIG. 2

3rd
Direction

2nd
Direction

1st
Direction

NONVOLATILE MEMORY DEVICE, OPERATING METHOD OF NONVOLATILE MEMORY DEVICE, AND MEMORY SYSTEM INCLUDING NONVOLATILE MEMORY DEVICE

CROSS-REFERENCE TO RELATED APPLICATION(S)

This application claims priority under 35 U.S.C. § 119 to Korean Patent Application No. 10-2024-0045905 filed on Apr. 4, 2024, in the Korean Intellectual Property Office, the disclosure of which is incorporated by reference herein in its entirety.

BACKGROUND

Embodiments of the present disclosure described herein relate to an electronic device, and more particularly, relate to a nonvolatile memory device with improved write and read reliability, an operating method of the nonvolatile memory device, and a storage device including the nonvolatile memory device.

A nonvolatile memory device includes a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), or a ferroelectric RAM (FRAM).

As semiconductor manufacturing technologies develop, the high integration of the nonvolatile memory device and an increase in a storage capacity of the nonvolatile memory device according to the high integration continue to progress. The high integration of the nonvolatile memory device makes it possible to reduce manufacturing costs of the nonvolatile memory device. Because the scale of a storage device decreases as the nonvolatile memory device is highly integrated, various issues which do not exist up to the now are being discovered.

Also, as semiconductor-related peripheral technologies develop, a speed which is required for the nonvolatile memory device is increasing. The increase in the required speed of the nonvolatile memory device causes a decrease in a time window which is capable of being consumed for the nonvolatile memory device to perform various operations. The decrease in the time window causes various other issues which are not discovered up to the now. Therefore, it is desired that a difference of speed for a plurality of output data of the nonvolatile memory device may be reduced.

SUMMARY

Embodiments of the present disclosure provide a nonvolatile memory device with improved write and read reliability, an operating method of the nonvolatile memory device, and a storage device including the nonvolatile memory device.

According to an embodiment, a memory device includes a memory cell array, and a write driver and sense amplifier that is connected to the memory cell array through bit lines. The memory cell array includes a first cell area that includes a plurality of first memory cells arranged on a plane corresponding to a first direction and a second direction perpendicular to the first direction, a second cell area that includes a plurality of second memory cells arranged on the plane so as to be disposed on one side of the first cell area in the first direction, a word line that extends in the first direction and is connected to the plurality of first memory cells and the plurality of second memory cells, first bit lines that extend in the second direction and are respectively connected to the plurality of first memory cells, and second bit lines that extend in the second direction and are respectively connected to the plurality of second memory cells. The word line includes a poly line that extends in the first direction on the plane, a metal line that is disposed over the poly line and extends in the first direction, a first contact that is disposed on one side of the first cell area in a direction facing away from the first direction and connects the poly line and the metal line along a third direction perpendicular to the first direction and the second direction, and a second contact that is disposed on one side of the second cell area in the first direction and connects the poly line and the metal line along the third direction. The write driver and sense amplifier receives a column address, and in response to the column address, selects a k-th first bit line (k being a positive integer) from the first contact from among the first bit lines and selects a k-th second bit line from the second contact from among the second bit lines.

According to an embodiment, an operating method of a memory device which includes a word line including a poly line, a metal line, a first contact and a second contact connecting the poly line and the metal line, and first bit lines and second bit lines between the first contact and the second contact includes receiving a column address, and in response to the column address, selecting a first bit line among the first bit lines and a second bit line among the second bit lines, based on an order from the first contact and an order from the second contact. The order of the selected first bit line from the first contact is the same as the order of the selected second bit line from the second contact.

According to an embodiment, a memory system includes a nonvolatile memory device, and a memory controller that controls the nonvolatile memory device. The nonvolatile memory device includes a word line that includes a poly line, a metal line, and a first contact and a second contact connecting the poly line and the metal line, first bit lines and second bit lines that are between the first contact and the second contact, memory cells that are connected to the word line, the first bit lines, and the second bit lines, and a write driver and sense amplifier that receives a column address from the memory controller, and in response to the column address, selects a first bit line among the first bit lines and a second bit line among the second bit lines based on an order from the first contact and an order from the second contact. The order of the selected first bit line from the first contact is the same as the order of the selected second bit line from the second contact.

BRIEF DESCRIPTION OF THE FIGURES

The above and other objects and features of the present disclosure will become apparent by describing in detail embodiments thereof with reference to the accompanying drawings.

FIG. 2 illustrates an example of a memory cell array and a write driver and sense amplifier in detail according to example embodiments.

FIG. 5 is a circuit diagram illustrating an example of a first input and output unit according to example embodiments.

FIG. 6 illustrates an example of a read and write unit according to an embodiment of the present disclosure.

FIG. 14 illustrates an example in which a first bit line is selected for a read operation in a first input and output unit and a second input and output unit.

DETAILED DESCRIPTION

Below, embodiments of the present disclosure will be described in detail and clearly to such an extent that an ordinary one in the art easily carries out the present disclosure.

Figure 1:
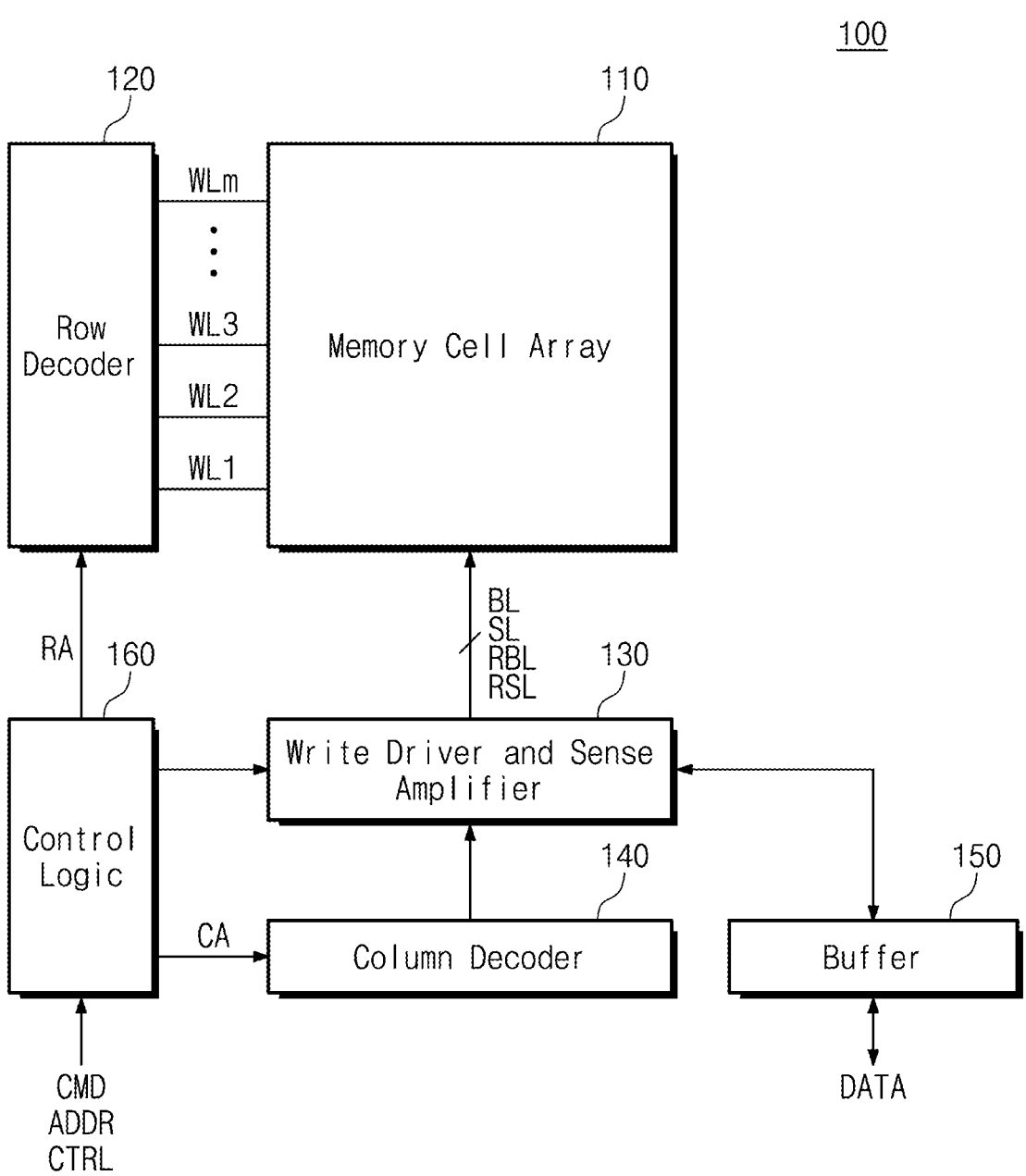
FIG. 1 is a block illustrating a nonvolatile memory device according to an embodiment of the present disclosure.

FIG. 1 illustrates a nonvolatile memory device 100 according to an embodiment of the present disclosure. Referring to FIG. 1, the nonvolatile memory device 100 may include a memory cell array 110, a row decoder 120, a write driver and sense amplifier 130, a column decoder 140, a buffer 150, and a control logic 160.

The memory cell array 110, the row decoder 120, the write driver and sense amplifier 130, the column decoder 140, the buffer 150, and the control logic 160 may be implemented with hardware distinguished from each other. The memory cell array 110, the row decoder 120, the write driver and sense amplifier 130, the column decoder 140, the buffer 150, and the control logic 160 may be called in combination with various terms "circuit", "block", "unit", etc.

The memory cell array 110 may include nonvolatile memory cells arranged in rows and columns. For example, the nonvolatile memory cells may include phase-change memory cells, ferroelectric memory cells, magnetic memory cells, or resistive memory cells. The rows of the nonvolatile memory cells may be connected to first to m-th word lines WL1 to WLm, m is a natural number equal to or greater than 2. The columns of the nonvolatile memory cells may be connected to bit lines BL, source lines SL, reference bit lines RBL, and reference source lines RSL.

The row decoder 120 may be connected to the rows of the nonvolatile memory cells of the memory cell array 110 through the first to m-th word lines WL1 to WLm. The row decoder 120 may receive a row address RA from the control logic 160. Based on the row address RA, the row decoder 120 may select one of the first to m-th word lines WL1 to WLm and may not select the remaining word lines thereof.

The row decoder 120 may apply a selection word line voltage to the selected word line and may apply a non-selection word line voltage to the unselected word lines (or may float the unselected word lines). For example, the level of the selection word line voltage and the level of the non-selection word line voltage may change depending on whether any of a first write operation (or a set operation), a second write operation (or a reset operation), or a read operation is performed.

The write driver and sense amplifier 130 may be connected to the columns of the nonvolatile memory cells of the memory cell array 110 through the bit lines BL, the source lines SL, the reference bit lines RBL, and the reference source lines RSL. For example, one bit line and one source line (or one reference bit line and one reference source line) may be connected to one column of the nonvolatile memory cells.

The write driver and sense amplifier 130 may include write driver circuits and sense amplifier circuits which respectively correspond to the bit lines BL (or the reference bit lines RBL) and respectively correspond to the source lines SL (or the reference source lines RSL). The write driver and sense amplifier 130 may receive a column address CA from the control logic 160.

During the write operation, based on the column address CA, some of the write driver circuits of the write driver and sense amplifier 130 may be activated, and the others thereof may be deactivated. Each of the activated write driver circuits may apply voltages for the write operation to a corresponding source line SL (or reference source line RSL) and a corresponding bit line BL (or reference bit line RBL). Each of the deactivated write driver circuits may apply voltages for inhibiting the write operation to a corresponding source line SL (or reference source line RSL) and a corresponding bit line BL (or reference bit line RBL) or may float the corresponding source line SL (or reference source line RSL) and the corresponding bit line BL (or reference bit line RBL).

During the read operation, based on the column address CA, some of the sense amplifier circuits of the write driver and sense amplifier 130 may be activated, and the others thereof may be deactivated. Each of the activated sense amplifier circuits may apply voltages for the read operation to a corresponding source line SL (or reference source line RSL) and a corresponding bit line BL (or reference bit line RBL). Each of the deactivated sense amplifier circuits may apply voltages for inhibiting the read operation to a corresponding source line SL (or reference source line RSL) and a corresponding bit line BL (or reference bit line RBL) or may float the corresponding source line SL (or reference source line RSL) and the corresponding bit line BL (or reference bit line RBL).

The column decoder 140 may perform switching (or gating) between the write driver and sense amplifier 130 and the memory cell array 110. The column decoder 140 may receive the column address CA from the control logic 160. Based on the column address CA, the column decoder 140 may perform switching such that the write driver circuits or sense amplifier circuits of the write driver and sense amplifier 130 are electrically connected to corresponding bit lines BL (or reference bit lines RBL) and corresponding source lines SL (or reference source lines RSL).

The buffer 150 may exchange data with an external device and may exchange data with the write driver and sense amplifier 130. The buffer 150 may transfer the data received from the external device to the activated write driver circuits of the write driver and sense amplifier 130. The buffer 150 may transfer the data sensed by the activated sense amplifier circuits to the external device.

The control logic 160 may receive a command CMD, an address ADDR, and a control signal CTRL from the external device. The command CMD and the address ADDR may be received in order of the command CMD and the address ADDR or in order of the address ADDR and the command CMD. Alternatively, the command CMD and the address ADDR may be simultaneously received.

The command CMD may include a write command and a read command. The write command may cause one of the first write (or set) operation and the second write (or reset) operation or all thereof. In response to the command CMD, the control logic 160 may control the row decoder 120, the write driver and sense amplifier 130, the column decoder 140, and the buffer 150 such that the write operation and the read operation is performed. The write operation may include one of the first write (or set) operation and the second write (or reset) operation or all thereof.

The address ADDR may include the row address RA and the column address CA. The control logic 160 may transfer the row address RA to the row decoder 120 and may transfer the column address CA to the write driver and sense amplifier 130 and the column decoder 140.

The control signal CTRL may include various signals which are used to control the nonvolatile memory device 100. For example, some of the signals included in the control signal CTRL may be bidirectional signals and may be used to notify the external device of the status of the nonvolatile memory device 100.

Figure 2:
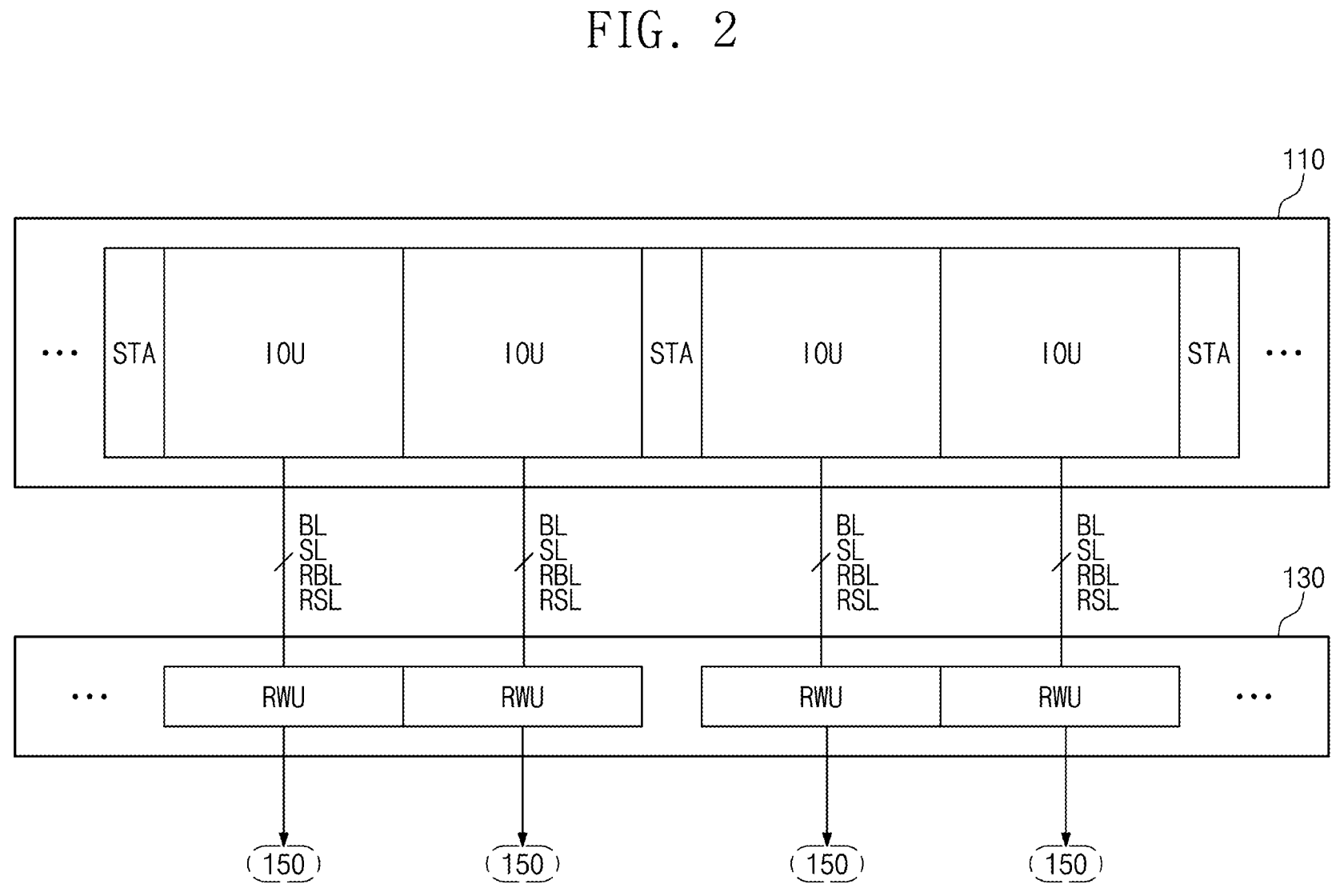

FIG. 2 illustrates an example of the memory cell array 110 and the write driver and sense amplifier 130 in detail according to example embodiments. Referring to FIGS. 1 and 2, the memory cell array 110 may include input and output units IOU and strap areas STA. Each of the input and output units IOU may be a unit of an input (e.g., a write operation) and an output (e.g., a read operation) of data.

One input and output unit IOU may include a plurality of memory cells. The memory cells of one input and output unit IOU may be connected to the bit lines BL, the source lines SL, the reference bit lines RBL, and the reference source lines RSL. The memory cells of one input and output unit IOU may be connected to the first to m-th word lines WL1 to WLm.

The strap area STA may refer to an area for the first to m-th word lines WL1 to WLm. Each of the first to m-th word lines WL1 to WLm may be implemented by using the strap area STA.

In an embodiment, one strap area STA may be disposed per even-numbered input and output units IOU. For example, one strap area STA may be disposed per two input and output units IOU.

The write driver and sense amplifier 130 may include read and write units (or circuits) RWU. Each of the read and write units RWU may include one write driver circuit and one sense amplifier circuit. Each of the read and write units RWU may perform the write operation on a memory cell connected to the bit line BL and the source line SL, which are selected by the column address CA, from among the bit lines BL and the source lines SL. Each of the read and write units RWU may perform the read operation (or write verify operation) on memory cells connected to the bit line BL and the source line SL, which are selected by the column address CA, from among the bit lines BL and the source lines SL, by using a reference memory cell connected to the reference bit line RBL and the reference source line RSL, which are selected by the column address CA, from among the reference bit lines RBL and the reference source lines RSL.

The write driver and sense amplifier 130 may access a plurality of input and output units IOU in parallel. Each of the read and write units RWU of the write driver and sense amplifier 130 may access one memory cell at a time.

Figure 3:
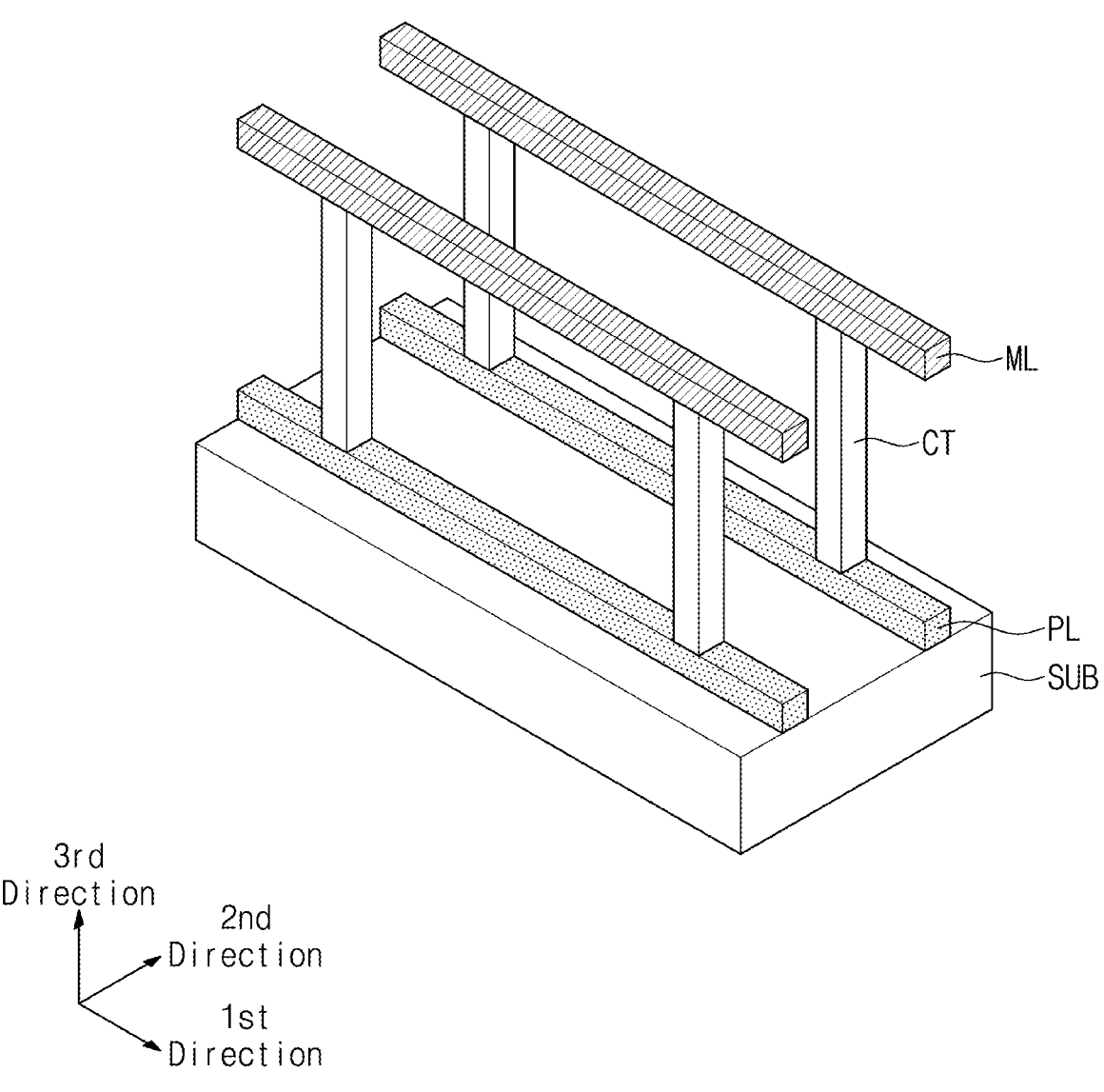
FIG. 3 illustrates an example of one word line among first to m-th word lines according to example embodiments.

FIG. 3 illustrates an example of two word lines among the first to m-th word lines WL1 to WLm according to example embodiments. Referring to FIGS. 1, 2, and 3, the memory cell array 110 may be implemented in a substrate SUB on a plane corresponding to a first direction and a second direction perpendicular to the first direction.

A word line may include a poly line PL extending on the substrate SUB in the first direction, a metal line ML disposed over the poly line PL and extending in the first direction, contacts CT extending in a third direction perpendicular to the first direction and the second direction and connecting the poly line PL and the metal line ML.

The poly line PL may include polysilicon. The polysilicon of the poly line PL may have a relatively large parasitic resistance. The parasitic resistance of the polysilicon of the poly line PL may degrade an operating characteristic of the nonvolatile memory device 100.

The metal line ML may include a metal material. The metal material of the metal line ML may have a relatively small parasitic resistance. The contacts CT may connect the poly line PL and the metal line ML in the strap area STA. As the metal line ML transfers a voltage to the poly line PL through the contacts CT, the operating characteristic of the nonvolatile memory device 100 may be prevented from being degraded due to the parasitic resistance of the polysilicon of the poly line PL.

Figure 4:
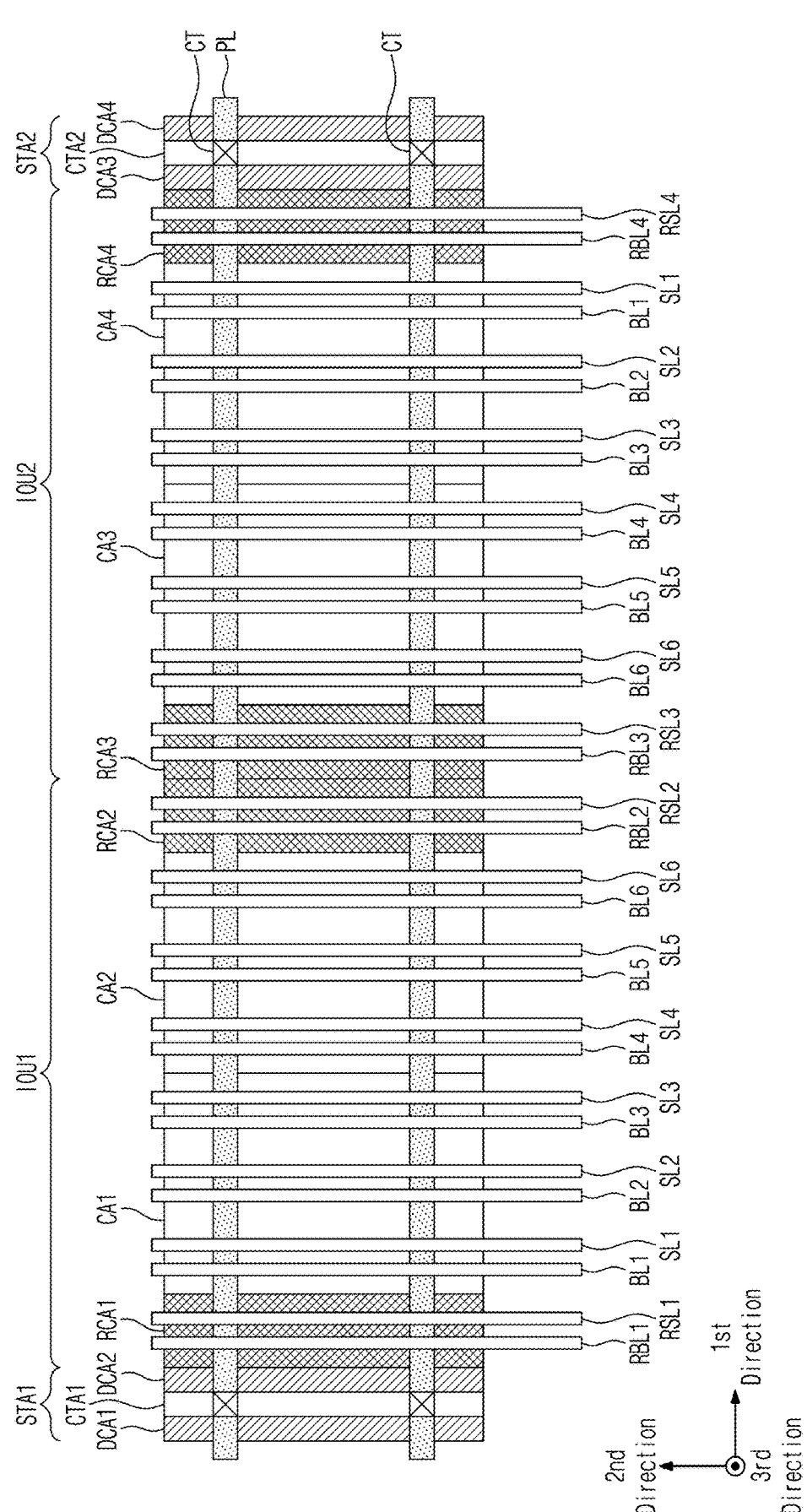
FIG. 4 illustrates an example of a first input and output unit, a second input and output unit, a first strap area, and a second strap area according to example embodiments.

FIG. 4 illustrates an example of a first input and output unit IOU1, a second input and output unit IOU2, a first strap area STA1, and a second strap area STA2, according to example embodiments. In an embodiment, the first input and output unit IOU1 and the second input and output unit IOU2 may correspond to the input and output units IOU of FIG. 2. The first strap area STA1 and the second strap area STA2 may correspond to the strap areas STA of FIG. 2.

Referring to FIGS. 1 to 4, the poly lines PL may extend in the first direction. In a first contact area CTA1 of the first strap area STA1 and a second contact area CTA2 of the second strap area STA2, the poly lines PL may be respectively connected to the metal lines ML through the contacts CT. For brevity of description, the metal lines ML are not illustrated in FIG. 4.

In the first input and output unit IOU1 and the second input and output unit IOU2, the poly lines PL may be connected to memory cells. One poly line PL among the poly lines PL may be connected to first memory cells, and another poly line PL among the poly lines PL may be connected to second memory cells distinguished from the first memory cells. For example, the poly lines PL may form gates of memory cells.

The first strap area STA1 may include the first contact area CTA1, a first dummy cell area DCA1, and a second dummy cell area DCA2. The contacts CT which connect the poly lines PL with the metal lines ML may be disposed in the first contact area CTA1. The first dummy cell area DCA1 and the second dummy cell area DCA2 may be disposed to surround the first contact area CTA1. In an embodiment, when the contacts CT are formed, the performance of memory cells of the first dummy cell area DCA1 and the second dummy cell area DCA2 adjacent to the first contact area CTA1 may be degraded by the influence of the process for forming the contacts CT. Accordingly, the memory cells of the first dummy cell area DCA1 and the memory cells of the second dummy cell area DCA2 may be left alone as dummy memory cells which are not used to store data.

The second strap area STA2 may include the second contact area CTA2, a third dummy cell area DCA3, and a fourth dummy cell area DCA4. The contacts CT which connect the poly lines PL with the metal lines ML may be disposed in the second contact area CTA2. The third dummy cell area DCA3 and the fourth dummy cell area DCA4 may be disposed to surround the second contact area CTA2. In an embodiment, when the contacts CT are formed, the performance of memory cells of the third dummy cell area DCA3 and the fourth dummy cell area DCA4 adjacent to the second contact area CTA2 may be degraded by the influence of the process for forming the contacts CT. Accordingly, the memory cells of the third dummy cell area DCA3 and the memory cells of the fourth dummy cell area DCA4 may be left alone as dummy memory cells which are not used to store data.

In an embodiment, the memory cells of the first dummy cell area DCA1, the second dummy cell area DCA2, the third dummy cell area DCA3, and the fourth dummy cell area DCA4 may be connected to dummy bit lines and dummy source lines. The dummy bit lines and the dummy source lines may be formed through the process but may be left alone without being used during the write operation or the read operation. In an embodiment, dummy memory cells which are connected to a dummy bit line and a dummy word line may also be provided in the first contact area CTA1 and the second contact area CTA2.

The first input and output unit area IOU1 may include a first cell area CA1, a second cell area CA2, a first reference cell area RCA1, and a second reference cell area RCA2. Rows of memory cells of the first cell area CAL and the second cell area CA2 may be connected to the poly lines PL. Columns of the memory cells of the first cell area CAL and the second cell area CA2 may be respectively connected to first to sixth bit lines BL1 to BL6 and may be respectively connected to first to sixth source lines SL1 to SL6.

Rows of reference memory cells of the first reference cell area RCA1 and the second reference cell area RCA2 may be connected to the poly lines PL. Columns of the reference memory cells of the first reference cell area RCA1 and the second reference cell area RCA2 may be respectively connected to first and second reference bit lines RBL1 and RBL2 and may be respectively connected to first and second reference source lines RSL1 and RSL2.

The second input and output unit area IOU2 may include a third cell area CA3, a fourth cell area CA4, a third reference cell area RCA3, and a fourth reference cell area RCA4. Rows of memory cells of the third cell area CA3 and the fourth cell area CA4 may be connected to the poly lines PL. Columns of the memory cells of the third cell area CA3 and the fourth cell area CA4 may be respectively connected to first to sixth bit lines BL1 to BL6 and may be respectively connected to first to sixth source lines SL1 to SL6.

Rows of reference memory cells of the third reference cell area RCA3 and the fourth reference cell area RCA4 may be connected to the poly lines PL. Columns of the reference memory cells of the third reference cell area RCA3 and the fourth reference cell area RCA4 may be respectively connected to third and fourth reference bit lines RBL3 and RBL4 and may be respectively connected to third and fourth reference source lines RSL3 and RSL4.

Figure 5:
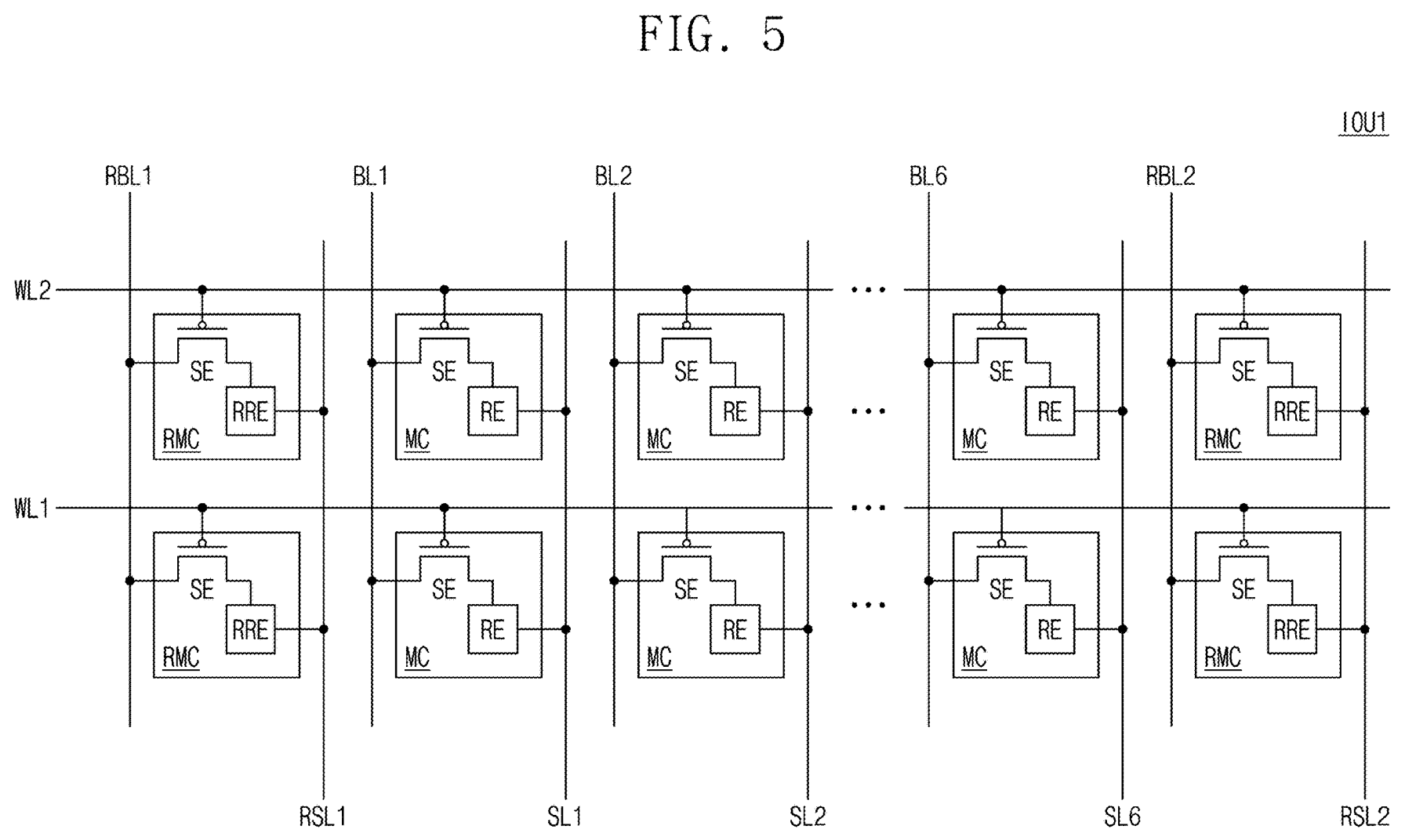

FIG. 5 is a circuit diagram illustrating an example of the first input and output unit IOU1 according to example embodiments. Referring to FIGS. 1 to 5, the first input and output unit IOU1 may include memory cells MC which are connected to a first word line WL1 and a second word line WL2 and are connected to the first to sixth bit lines BL1 to BL6 and the first to sixth source lines SL1 to SL6. Each of the first word line WL1 and the second word line WL2 may include the poly line PL, the metal line ML, and contacts connecting the poly line PL and the metal line ML.

Each of the memory cells MC may include a selection transistor SE and a resistance element RE connected to each other. For example, the selection transistor SE may be a transistor including a gate connected to a corresponding word line, a first terminal connected to a corresponding bit line, and a second terminal connected to a corresponding resistance element RE. For example, the selection transistor SE may be a p-channel metal oxide semiconductor (PMOS) transistor or an n-channel MOS (NMOS) transistor.

The resistance element RE may have a resistance value which is varied by a voltage of the corresponding bit line transferred through the selection transistor SE and a voltage of a corresponding source line. For example, the resistance element RE may include a spin transfer torque (STT) element, a magnetic tunnel junction (MTJ) element, a phase-change element, a ferroelectric element, a resistive element, etc.

The first input and output unit IOU1 may further include reference memory cells RMC which are connected to the first word line WL1 and the second word line WL2 and are connected to the first and second reference bit lines RBL1 and RBL2 and the first and second reference source lines RSL1 and RSL2.

Each of the reference memory cells RMC may include a selection transistor SE and a reference resistance element RRE connected to each other. For example, the selection transistor SE may be a transistor including a gate connected to a corresponding word line, a first terminal connected to a corresponding reference bit line, and a second terminal connected to a corresponding reference resistance element RRE.

In an embodiment, the reference resistance element RRE may have a resistance value which is varied by a voltage of the corresponding reference bit line transferred through the selection transistor SE and a voltage of a corresponding reference source line. For example, the resistance element RRE may include a spin transfer torque (STT) element, a magnetic tunnel junction (MTJ) element, a phase-change element, a ferroelectric element, a resistive element, etc. As another example, the reference resistance element RRE may include a resistor having a given resistance value. When the resistance value of the reference resistance element RRE is variable, the structure of the reference memory cell RMC may be the same as the structure of the memory cell MC.

Figure 6:
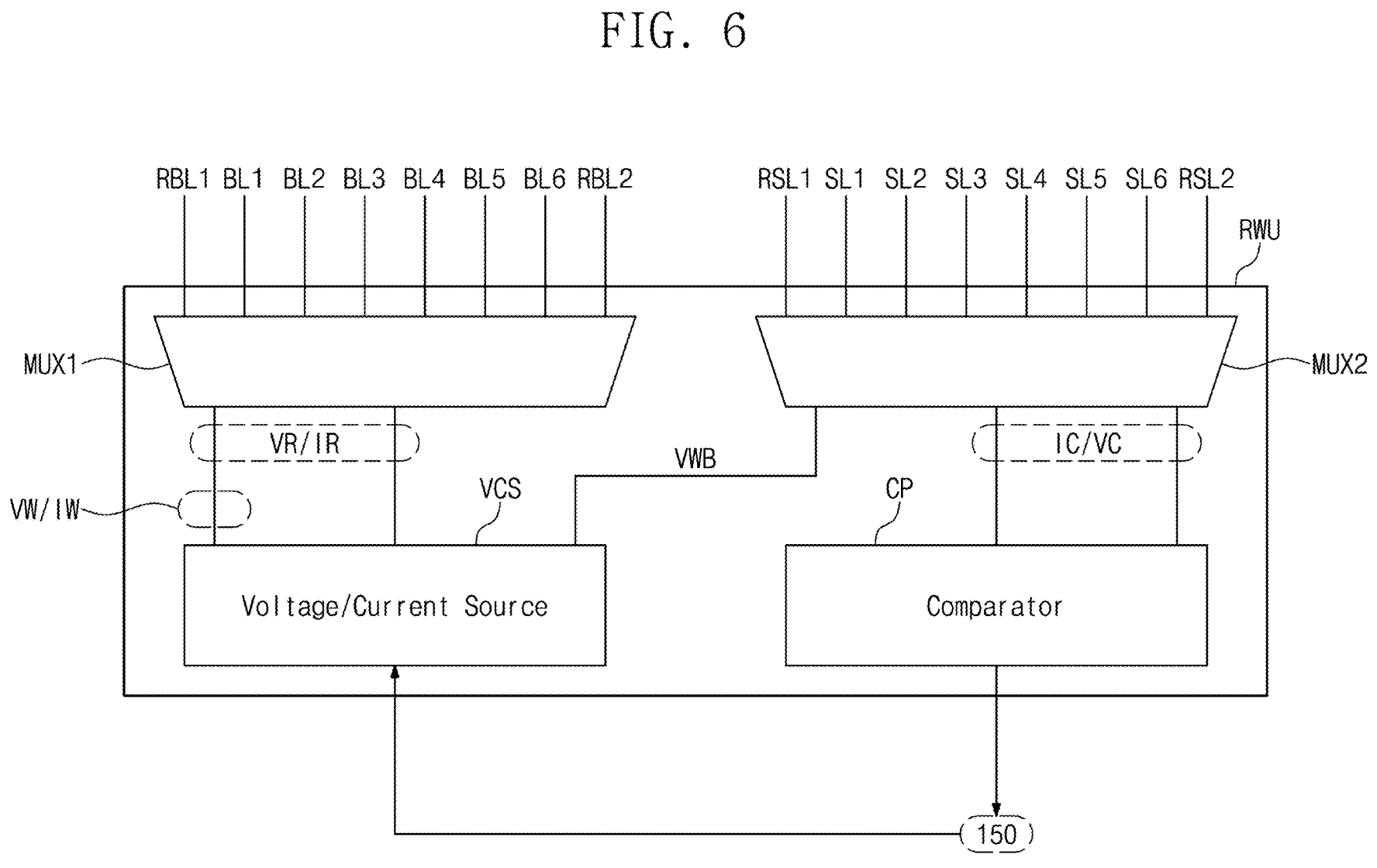

FIG. 6 illustrates an example of the read and write unit RWU according to an embodiment of the present disclosure. Referring to FIGS. 1 to 6, the read and write unit RWU may include a first multiplexer MUX1, a second multiplexer MUX2, a voltage/current source VCS, and a comparator CP.

The first multiplexer MUX1 may operate under control of the column decoder 140. For example, during the write operation, under control of the column decoder 140, the first multiplexer MUX1 may connect a bit line selected by the column decoder 140 from among the first to sixth bit lines BL1 to BL6 to the voltage/current source VCS. During the read operation or the write verify operation, under control of the column decoder 140, the first multiplexer MUX1 may connect one reference bit line selected by the column decoder 140 from among the first reference bit line RBL1 and the second reference bit line RBL2 to the voltage/current source VCS and may connect a bit line selected by the column decoder 140 from among the first to sixth bit lines BL1 to BL6 to the voltage/current source VCS.

The second multiplexer MUX2 may operate under control of the column decoder 140. For example, during the write operation, under control of the column decoder 140, the second multiplexer MUX2 may connect a source line selected by the column decoder 140 from among the first to sixth source lines SL1 to SL6 to the voltage/current source VCS. During the read operation or the write verify operation, under control of the column decoder 140, the second multiplexer MUX2 may connect one reference source line selected by the column decoder 140 from among the first reference source line RSL1 and the second reference source line RSL2 to the comparator CP and may connect a source line selected by the column decoder 140 from among the first to sixth source lines SL1 to SL6 to the comparator CP.

The voltage/current source VCS may generate various voltages or currents which are used during the write operation, the read operation, or the write verify operation. For example, during the write operation, the voltage/current source VCS may generate a write voltage VW or a write current IW and may supply the generated write voltage VW or the generated write current IW to a bit line selected by the first multiplexer MUX1 from among the first to sixth bit lines BL1 to BL6. Also, during the write operation, the voltage/current source VCS may generate a write bias voltage VWB and may supply the generated write bias voltage VWB to a source line selected by the second multiplexer MUX2 from among the first to sixth source lines SL1 to SL6. In an embodiment, the level of the write voltage VW or the amount of write current IW may vary depending on the write data transferred from the buffer 150.

During the read operation or the write verify operation, the voltage/current source VCS may generate a read voltage VR or a read current IR and may supply the generated read voltage VR or the generated read current IR to a bit line selected by the first multiplexer MUX1 from among the first to sixth bit lines BL1 to BL6 and a reference bit line selected by the first multiplexer MUX1 from among the first and second reference bit lines RBL1 and RBL2.

The comparator CP may compare a cell current IC or a cell voltage VC of a source line selected by the second multiplexer MUX2 from among the first to sixth source lines SL1 to SL6 with a cell current IC or a cell voltage VC of a reference source line selected by the second multiplexer MUX2 from among the first reference source line RSL1 and the second reference source line RSL2. The comparator CP may transfer a comparison result as the read data to the buffer 150.

In an embodiment, the read and write unit RWU is illustrated as including the first multiplexer MUX1 and the second multiplexer MUX2. However, the read and write unit RWU may control the first to sixth bit lines BL1 to BL6, the first to sixth source lines SL1 to SL6, the first and second reference bit lines RBL1 and RBL2, and the first and second reference source lines RSL1 and RSL2 by using one multiplexer controlled by the column decoder 140.

In an embodiment, in the voltage/current source VCS, components generating the write voltage VW or the write current IW and components generating the write bias voltage VWB may constitute the write driver circuit described above. Also, in the voltage/current source VCS, components generating the read voltage VR or the read current IR and the comparator CP may constitute the sense amplifier circuit described above.

In contrast, in an embodiment, the first multiplexer MUX1 may receive the first to sixth source lines SL1 to SL6 and the first and second reference source lines RSL1 and RSL2, and connect a source line selected by the column decoder 140 from among the first to sixth source lines SL1 to SL6 to the voltage/current source VCS. During the read operation or the write verify operation, under control of the column decoder 140, set the first multiplexer MUX1 may connect one reference source line selected by the column decoder 140 from among the first reference source line RSL1 and the second reference source line RSL2 to the comparator CP and may connect a source line selected by the column decoder 140 from among the first to sixth source lines SL1 to SL6 to the comparator CP. Also, the second multiplexer MUX2 may receive the first to sixth bit lines BL1 to BL6 and the first and second reference bit lines RBL1 and RBL2, and connect a bit line selected by the column decoder 140 from among the first to sixth bit lines BL1 to BL6 to the voltage/current source VCS. During the read operation or the write verify operation, under control of the column decoder 140, the second multiplexer MUX2 may connect one reference bit line selected by the column decoder 140 from among the first reference bit line RBL1 and the second reference bit line RBL2 to the voltage/current source VCS and may connect a bit line selected by the column decoder 140 from among the first to sixth bit lines BL1 to BL6 to the voltage/current source VCS.

Figure 7:
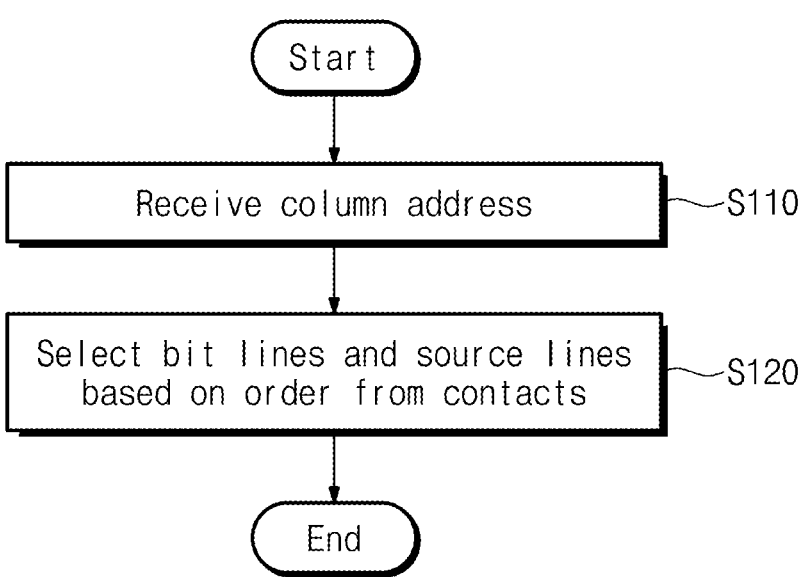
FIG. 7 illustrates an operating method of a nonvolatile memory device according to an embodiment of the present disclosure.

FIG. 7 illustrates an operating method of the nonvolatile memory device 100 according to an embodiment of the present disclosure. Referring to FIGS. 1, 4, and 7, in operation S110, the nonvolatile memory device 100 may receive the column address CA. For example, the column address CA may be received as a portion of the address ADDR.

In operation S120, the nonvolatile memory device 100 may select bit lines and source lines based on an order from the contacts CT. For example, in response to the same column address CA, the column address CA may control the first multiplexers MUX1 and the second multiplexers MUX2 of the read and write units RWU such that there are selected bit lines and source lines located at the same orders from contacts.

Figure 8:
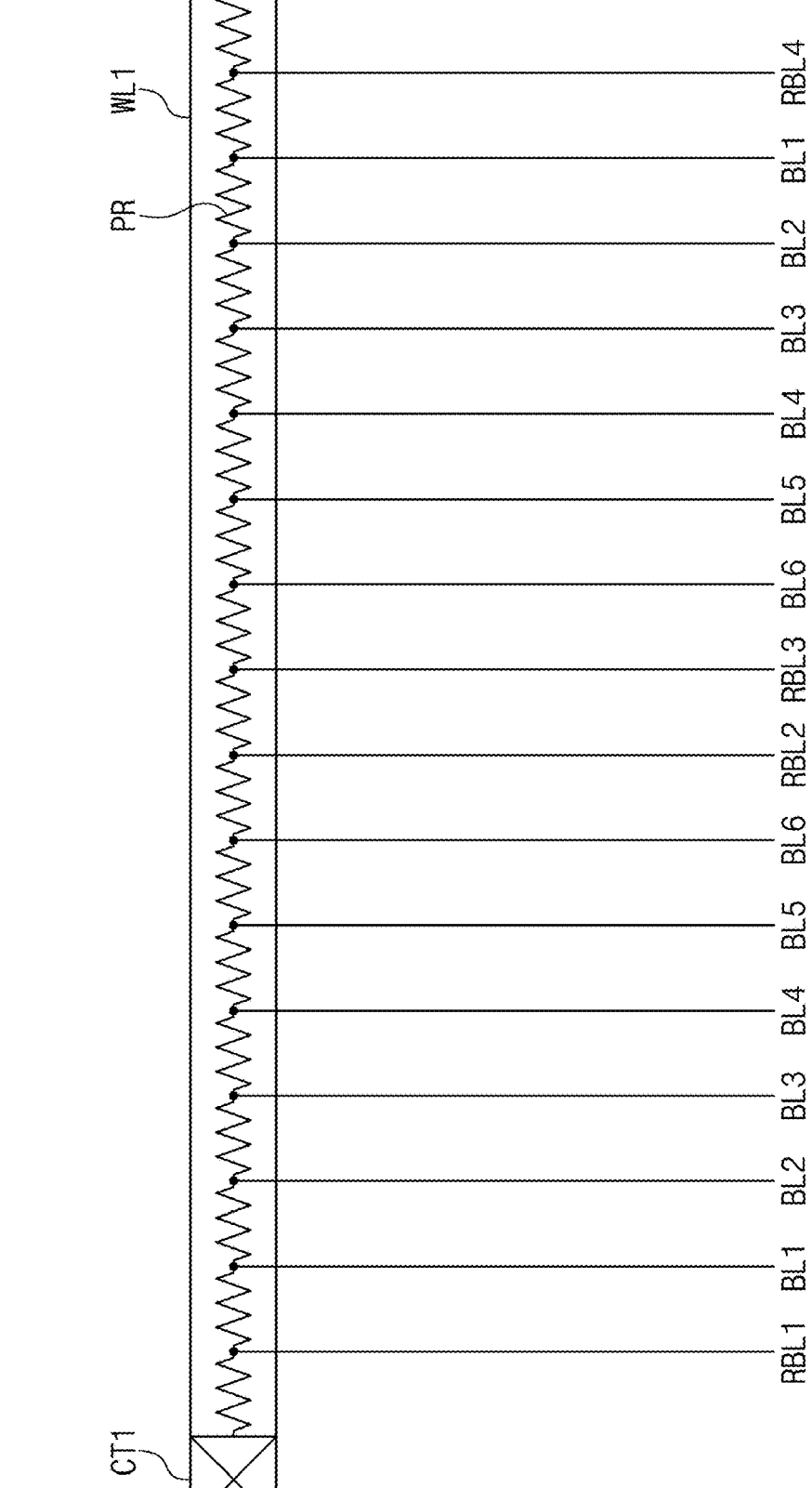
FIG. 8 illustrates a modeling example of parasitic resistances associated with a first word line, first to sixth bit lines, and first to fourth reference bit lines according to example embodiments.

FIG. 8 illustrates a modeling example of parasitic resistances PR associated with the first word line WL1, the first to sixth bit lines BL1 to BL6, and the first to fourth reference bit lines RBL1 to RBL4, according to example embodiments. Referring to FIGS. 3, 4, and 8, the first word line WL1 may include the poly line PL and the metal line ML. The poly line PL may be used to supply a voltage directly to the gates of the selection transistors SE of the memory cells MC or the reference memory cells RMC. Resistance values of the parasitic resistances PR of the poly line PL may be relatively large.

To prevent the reduction of performance of the nonvolatile memory device 100 due to the parasitic resistances PR of the poly line PL, the metal line ML whose parasitic resistance is relatively small may supply a voltage to the poly line PL through a first contact CT1 and a second contact CT2. Effective parasitic resistances PR which are applied to the memory cells MC and the reference memory cells RMC at locations of the first to sixth bit lines BL1 to BL6 corresponding to locations of the memory cells MC and locations of the first and second reference bit lines RBL1 and RBL2 corresponding to the reference memory cells RMC may be determined by a distance (or order) from the first contact CT1 and a distance (or order) from the second contact CT2. For example, each of the parasitic resistances PR of the poly line PL may be determined by a distance between the first contact CT1 and the first reference bit line RBL1, between two adjacent bit lines of the first to sixth bit lines BL1 to BL6, and between the second contact CT2 and the fourth reference bit line RBL4.

In the first input and output unit IOU1 and the second input and output unit IOU2 of the nonvolatile memory device 100 according to an embodiment of the present disclosure, the order (e.g., ordering) of bit lines and the order (e.g., ordering) of source lines may be identical depending on the distances from the first contact CT1 and the second contact CT2. Accordingly, when a specific bit line or source line is accessed, the order (or distance) of a to-be-accessed bit line and a to-be-accessed source line of the first input and output unit IOU1 from a first contact may be identical to the order (or distance) of a to-be-accessed bit line and a to-be-accessed source line of the second input and output unit IOU2 from a second contact. Because the same effective parasitic resistance of the poly line PL is applied to the first input and output unit IOU1 and the second input and output unit IOU2, access features of the first input and output unit IOU1 and the second input and output unit IOU2 may be uniform, and thus, the reliability of the nonvolatile memory device 100 is improved.

Figure 9:
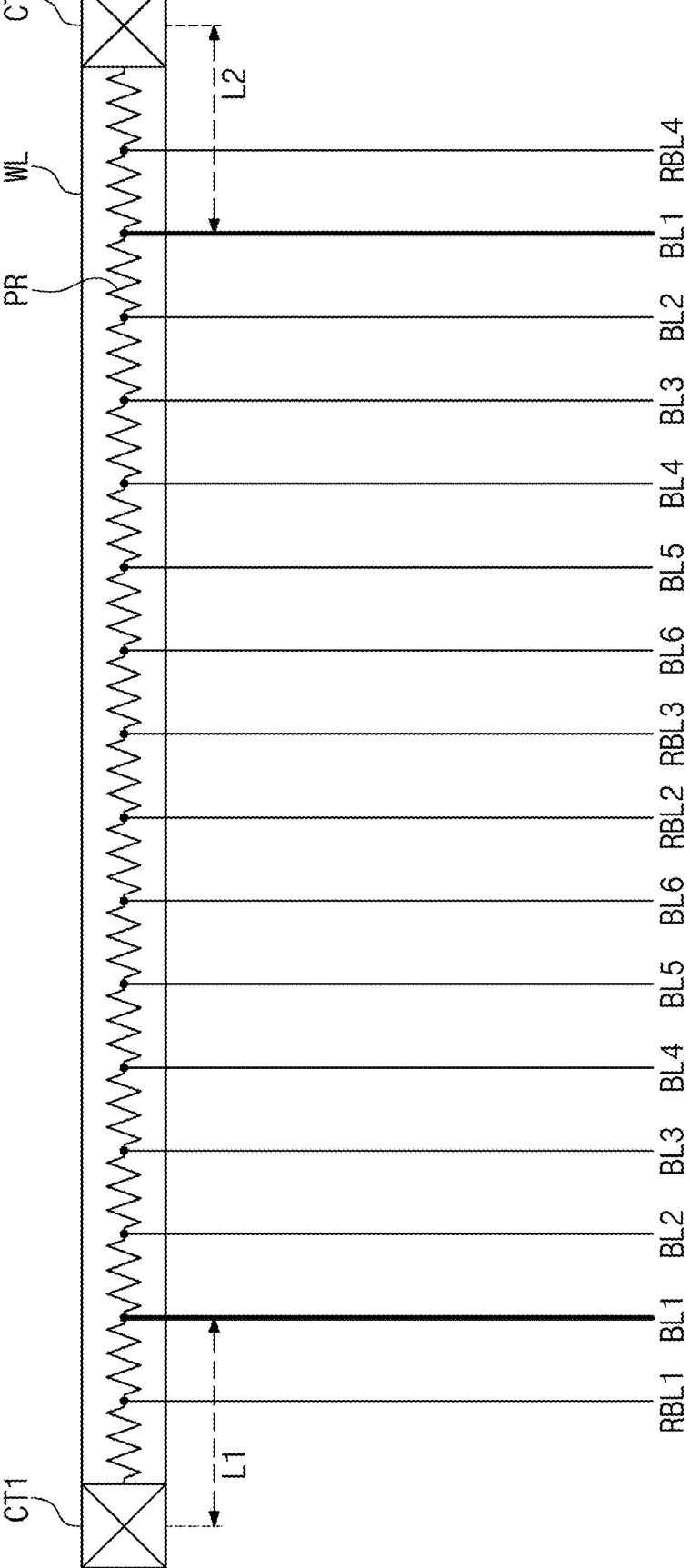
FIG. 9 illustrates an example of performing a write operation on a first bit line in each of a first input and output unit and a second input and output unit according to example embodiments.

FIG. 9 illustrates an example of performing a write operation on a first bit line BL1 in each of the first input and output unit IOU1 and the second input and output unit IOU2 according to example embodiments. Referring to FIGS. 3, 4, and 9, when the column address CA indicates the first bit line BL1, the column decoder 140 may select the first bit line BL1 by controlling the read and write unit RWU of the first input and output unit IOU1 and controlling the read and write unit RWU of the second input and output unit IOU2.

In the first input and output unit IOU1, a distance from the first contact CT1 to the first bit line BL1 may be a first distance L1. In an embodiment, an effective resistance value of two parasitic resistances PR may be applied between the first contact CT1 and the first bit line BL1 of the first input and output unit IOU1.

In the second input and output unit IOU2, a distance from the second contact CT2 to the first bit line BL1 may be a second distance L2. In an embodiment, an effective resistance value of two parasitic resistances PR may be applied between the second contact CT2 and the first bit line BL1 of the second input and output unit IOU2.

The first distance L1 and the second distance L2 may be identical. When there is performed the write operation on the memory cells MC connected to the first bit line BL1, the first input and output unit IOU1 and the second input and output unit IOU2 may experience the same resistance value of parasitic resistances PR. Accordingly, features of the write operations of the nonvolatile memory device 100 may be uniform, and the reliability of data written in the memory cells MC is improved.

Figure 10:
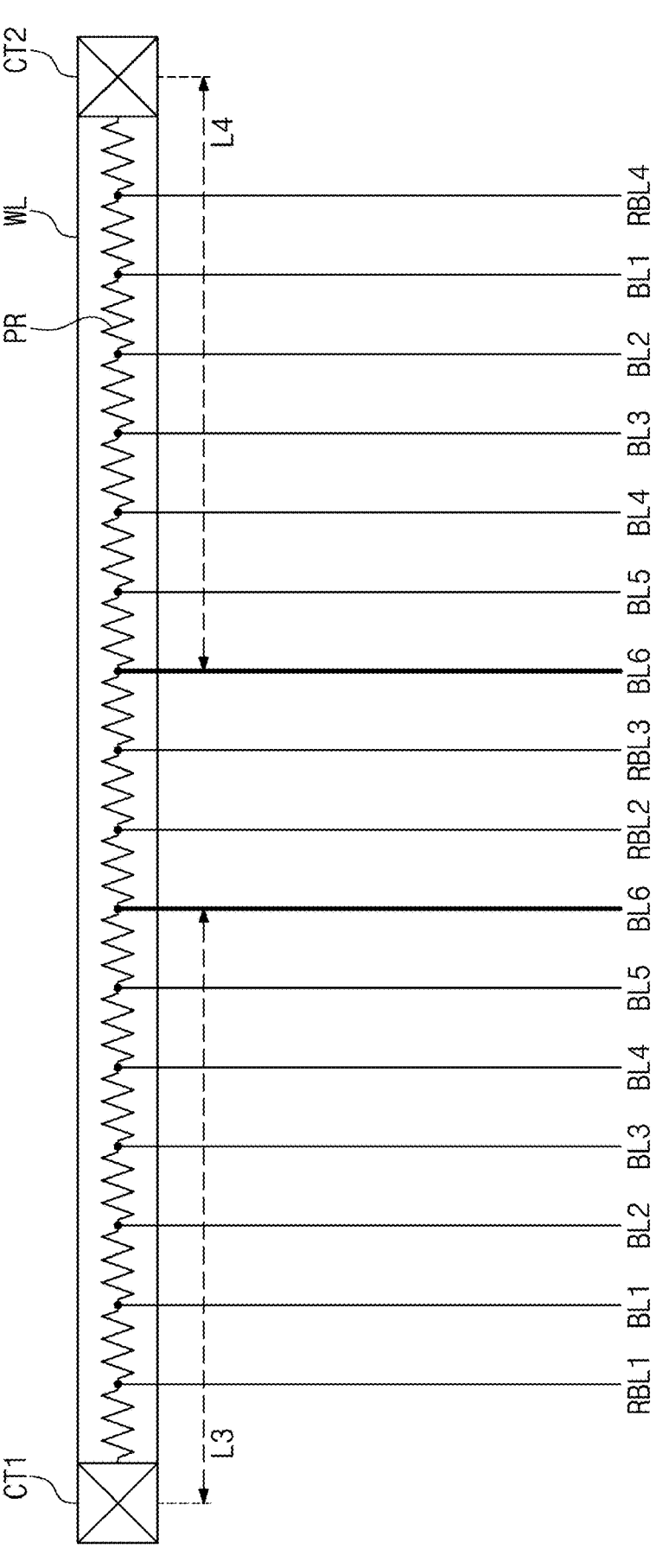
FIG. 10 illustrates an example of performing a write operation on a sixth bit line in each of a first input and output unit and a second input and output unit according to example embodiments.

FIG. 10 illustrates an example of performing a write operation on a sixth bit line BL6 in each of the first input and output unit IOU1 and the second input and output unit IOU2 according to example embodiments. Referring to FIGS. 3, 4, and 10, when the column address CA indicates the sixth bit line BL6, the column decoder 140 may select the sixth bit line BL6 by controlling the read and write unit RWU of the first input and output unit IOU1 and controlling the read and write unit RWU of the second input and output unit IOU2.

In the first input and output unit IOU1, a distance from the first contact CT1 to the sixth bit line BL6 may be a third distance L3. In an embodiment, an effective resistance value of seven parasitic resistances PR may be applied between the first contact CT1 and the sixth bit line BL6 of the first input and output unit IOU1.

In the second input and output unit IOU2, a distance from the second contact CT2 to the sixth bit line BL6 may be a fourth distance L4. In an embodiment, an effective resistance value of seven parasitic resistances PR may be applied between the second contact CT2 and the sixth bit line BL6 of the second input and output unit IOU2.

The third distance L3 and the fourth distance L4 may be identical. When there is performed the write operation on the memory cells MC connected to the sixth bit line BL6, the first input and output unit IOU1 and the second input and output unit IOU2 may experience the same resistance value of parasitic resistances PR. Accordingly, features of the write operations of the nonvolatile memory device 100 may be uniform, and the reliability of data written in the memory cells MC is improved.

Figure 11:
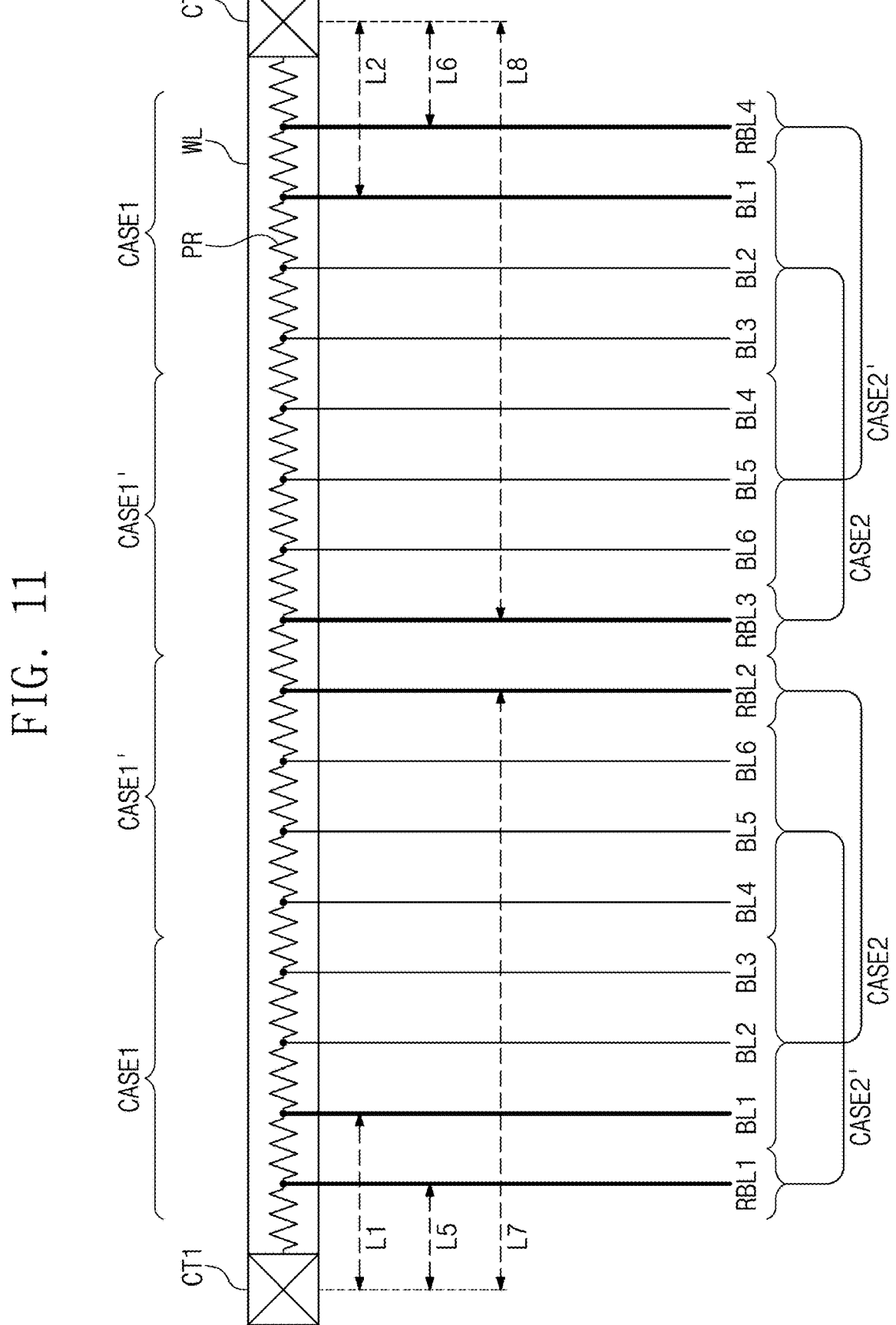
FIG. 11 illustrates an example of performing a read operation on a first bit line in each of a first input and output unit and a second input and output unit according to example embodiments.

FIG. 11 illustrates an example of performing a read operation on the first bit line BL1 in each of the first input and output unit IOU1 and the second input and output unit IOU2 according to example embodiments. Referring to FIGS. 3, 4, and 11, when the column address CA indicates the first bit line BL1, the column decoder 140 may select the first bit line BL1 in each of the first and second input and output units IOU1 and IOU2 by controlling the read and write unit RWU of the first input and output unit IOU1 and controlling the read and write unit RWU of the second input and output unit IOU2. For example, the read and write unit RWU of each of the first input and output unit IOU1 and the second input and output unit IOU2 may simultaneously output read data from the selected memory cell through the first bit line BL1 in each of the first and second input and output unit IOU1 and the second input and output unit IOU2.

In a first case CASE1, when the column address CA indicates the first bit line BL1, the column decoder 140 may control the read and write unit RWU of the first input and output unit IOU1 to select the first bit line BL1 and the first reference bit line RBL1 in the first input and output unit IOU1. Also, when the column address CA indicates the first bit line BL1, the column decoder 140 may control the read and write unit RWU of the second input and output unit IOU2 to select the first bit line BL1 and the fourth reference bit line RBL4 in the second input and output unit IOU2.

The first distance L1 between the first bit line BL1 and the first contact CT1 in the first input and output unit IOU1 may be identical to the second distance L2 between the first bit line BL1 and the second contact CT2 in the second input and output unit IOU2. Accordingly, the resistance value of the parasitic resistance PR which is effectively applied between the first contact CT1 and the first bit line BL1 of the first input and output unit IOU1 may be identical to the resistance value of the parasitic resistance PR which is effectively applied between the second contact CT2 and the first bit line BL1 of the second input and output unit IOU2.

Also, a fifth distance L5 between the first reference bit line RBL1 and the first contact CT1 in the first input and output unit IOU1 may be identical to a sixth distance L6 between the fourth reference bit line RBL4 and the second contact CT2 in the second input and output unit IOU2. Accordingly, the resistance value of the parasitic resistance PR which is effectively applied between the first contact CT1 and the first reference bit line RBL1 of the first input and output unit IOU1 may be identical to the resistance value of the parasitic resistance PR which is effectively applied between the second contact CT2 and the fourth reference bit line RBL4 of the second input and output unit IOU2.

In a first case CASE1', when the column address CA indicates the sixth bit line BL6, the column decoder 140 may control the read and write unit RWU of the first input and output unit IOU1 to select the sixth bit line BL6 and the second reference bit line RBL2 in the first input and output unit IOU1. Also, when the column address CA indicates the sixth bit line BL6, the column decoder 140 may control the read and write unit RWU of the second input and output unit IOU2 to select the sixth bit line BL6 and the third reference bit line RBL3 in the second input and output unit IOU2.

The third distance L3 (in FIG. 10) between the sixth bit line BL6 and the first contact CT1 in the first input and output unit IOU1 may be identical to the fourth distance L4 (in FIG. 10) between the sixth bit line BL6 and the second contact CT2 in the second input and output unit IOU2. Accordingly, the resistance value of the parasitic resistances PR which is effectively applied between the first contact CT1 and the sixth bit line BL6 in the first input and output unit IOU1 may be identical to the resistance value of the parasitic resistances PR which is effectively applied between the second contact CT2 and the sixth bit line BL6 in the second input and output unit IOU2.

Also, a seventh distance L7 between the second reference bit line RBL2 and the first contact CT1 in the first input and output unit IOU1 may be identical to an eighth distance L8 between the third reference bit line RBL3 and the second contact CT2 in the second input and output unit IOU2. Accordingly, the resistance value of the parasitic resistances PR which is effectively applied between the first contact CT1 and the second reference bit line RBL2 in the first input and output unit IOU1 may be identical to the resistance value of the parasitic resistances PR which is effectively applied between the second contact CT2 and the third reference bit line RBL3 in the second input and output unit IOU2.

In a second case CASE2, the second reference bit line RBL2 may be selected for the read operation of the first to third bit lines BL1 to BL3 in the first input and output unit IOU1. For example, when the column address CA indicates the first bit line BL1, the column decoder 140 may control the read and write unit RWU of the first input and output unit IOU1 to select the first bit line BL1 and the second reference bit line RBL2 in the first input and output unit IOU1. Also, the third reference bit line RBL3 may be selected for the read operation of the first to third bit lines BL1 to BL3 in the second input and output unit IOU2. For example, when the column address CA indicates the first bit line BL1, the column decoder 140 may control the read and write unit RWU of the second input and output unit IOU2 to select the first bit line BL1 and the third reference bit line RBL3 in the second input and output unit IOU2. In this case, the resistance value of the parasitic resistances PR which is effectively applied between the first contact CT1 and the second reference bit line RBL2 in the first input and output unit IOU1 may be identical to the resistance value of the parasitic resistances PR which is effectively applied between the second contact CT2 and the third reference bit line RBL3 in the second input and output unit IOU2.

In a second case CASE2', the first reference bit line RBL1 may be selected for the read operation of the fourth to sixth bit lines BL4 to BL6 in the first input and output unit IOU1. For example, when the column address CA indicates the sixth bit line BL6, the column decoder 140 may control the read and write unit RWU of the first input and output unit IOU1 to select the sixth bit line BL6 and the first reference bit line RBL1 in the first input and output unit IOU1. Also, the fourth reference bit line RBL4 may be selected for the read operation of the fourth to sixth bit lines BL4 to BL6 in the second input and output unit IOU2. For example, when the column address CA indicates the sixth bit line BL6, the column decoder 140 may control the read and write unit RWU of the second input and output unit IOU2 to select the sixth bit line BL6 and the fourth reference bit line RBL4 in the second input and output unit IOU2. In this case, the resistance value of the parasitic resistances PR which is effectively applied between the first contact CT1 and the sixth bit line BL6 in the first input and output unit IOU1 may be identical to the resistance value of the parasitic resistances PR which is effectively applied between the second contact CT2 and the sixth bit line BL6 in the second input and output unit IOU2. Also, the resistance value of the parasitic resistance PR which is effectively applied between the first contact CT1 and the first reference bit line RBL1 in the first input and output unit IOU1 may be identical to the resistance value of the parasitic resistance PR which is effectively applied between the second contact CT2 and the fourth reference bit line RBL4 in the second input and output unit IOU2.

During the read operation, the parasitic resistances PR which are applied to the memory cell MC and the reference memory cell RMC of the first input and output unit IOU1 may be identical to the parasitic resistances PR which are applied to the memory cell MC and the reference memory cell RMC of the second input and output unit IOU2. For example, the parasitic resistance PR which is applied to the memory cell MC of the first input and output unit IOU1 may be identical to the parasitic resistance PR which is applied to the memory cell MC in the second input and output unit IOU2, and the parasitic resistance PR which is applied to the reference memory cell RMC of the first input and output unit IOU1 may be identical to the parasitic resistance PR which is applied to the reference memory cell RMC in the second input and output unit IOU2. For example, the directivity of an error which is caused by the parasitic resistances PR in the first input and output unit IOU1 may be identical to the directivity of an error which is caused by the parasitic resistances PR in the second input and output unit IOU2. Accordingly, the nonvolatile memory device 100 may set access voltages or currents based on the same directivity, and the access margin may be improved. In an embodiment, the access margin may indicate a margin in which an access (or a read operation) is successfully performed even though resistance values of the memory cells MC or the reference memory cells RMC are different from a given value.

Figure 12:
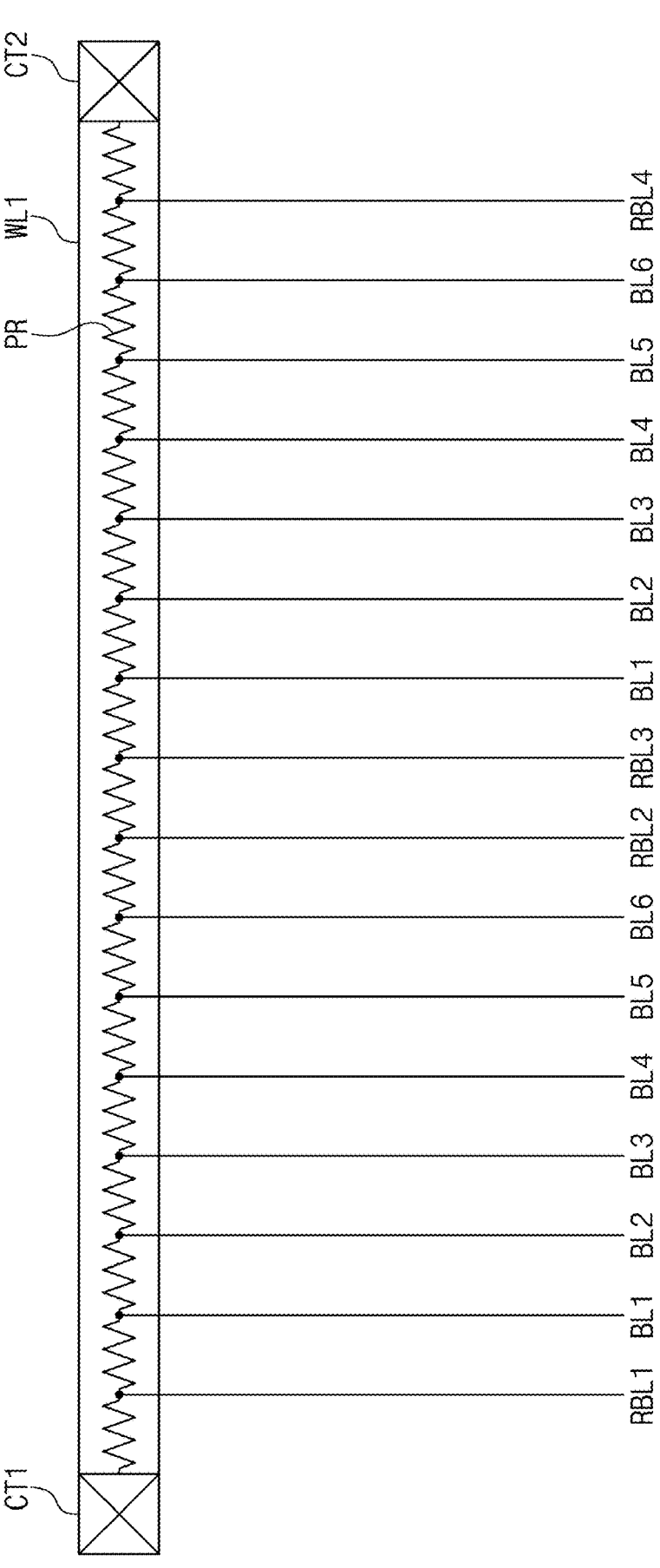
FIG. 12 illustrates an example in which an order of bit lines is determined depending on a conventional example.

FIG. 12 illustrates an example in which an order (e.g., ordering) of bit lines is determined depending on a conventional example. Referring to FIG. 12, in an embodiment, in the first input and output unit IOU1 and the second input and output unit IOU2, the order (or ordering) of the first to sixth bit lines BL1 to BL6 may be identical in a direction from the first contact CT1 to the second contact CT2.

Figure 13:
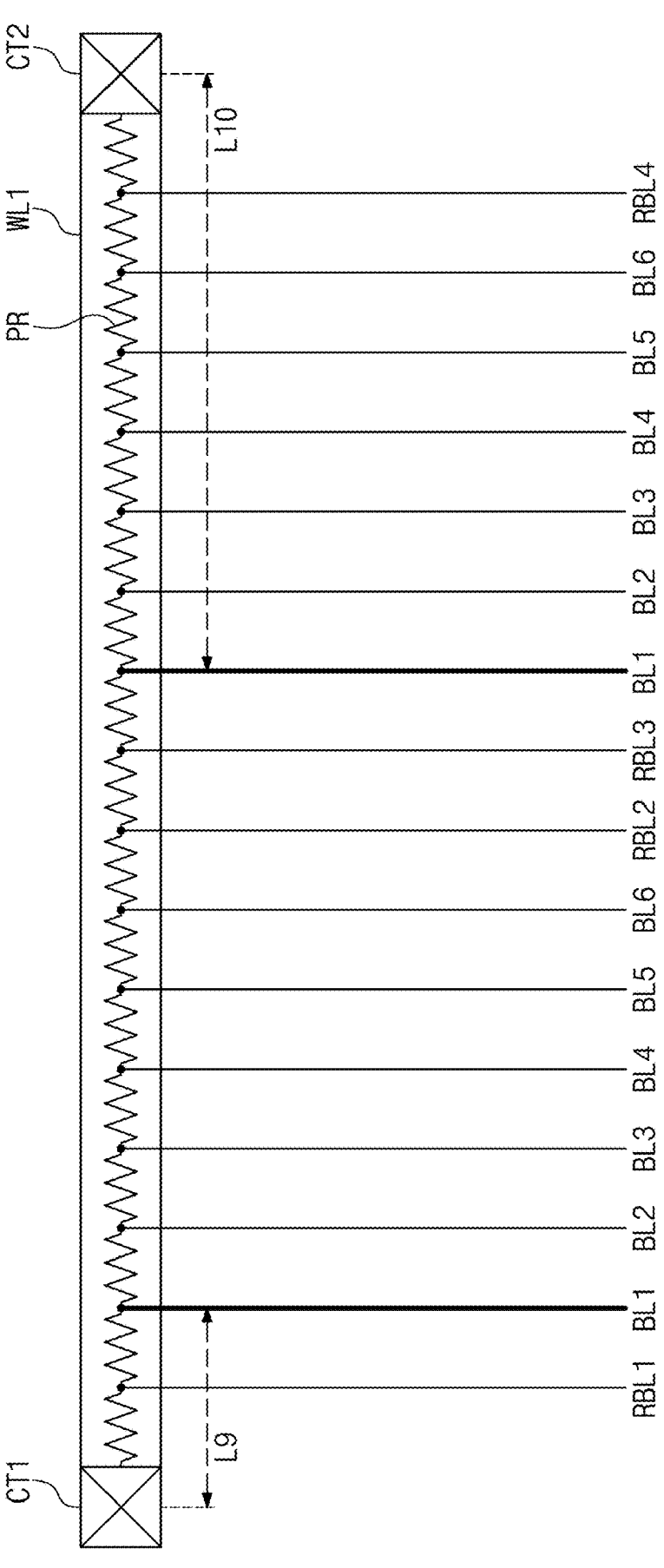
FIG. 13 illustrates an example in which a first bit line is selected for a write operation in a first input and output unit and a second input and output unit.

FIG. 13 illustrates an example in which the first bit line BL1 is selected for the write operation in the first input and output unit IOU1 and the second input and output unit IOU2. Referring to FIG. 13, in the first input and output unit IOU1, a distance from the first contact CT1 to the first bit line BL1 of the first input and output unit IOU1 may be a ninth distance L9. In this case, two parasitic resistances PR may be effectively applied between the first contact CT1 and the first bit line BL1 of the first input and output unit IOU1.

In the second input and output unit IOU2, a distance from the second contact CT2 to the first bit line BL1 may be a tenth distance L10. In this case, seven parasitic resistances PR may be effectively applied between the second contact CT2 and the first bit line BL1 of the second input and output unit IOU2.

In the embodiment described with reference to FIGS. 9 and 10, during the write operation, a distance between a to-be-accessed memory cell and the first contact CT1 in the first input and output unit IOU1 may be identical to a distance between a to-be-accessed memory cell and the second contact CT2 in the second input and output unit IOU2. For example, in the embodiment described with reference to FIGS. 9 and 10, the influence of the parasitic resistances PR applied to the write operation of the first input and output unit IOU1 may be identical to the influence of the parasitic resistances PR applied to the write operation of the second input and output unit IOU2. Accordingly, a phenomenon that a result of the write operation of the first input and output unit IOU1 and a result of the write operation of the second input and output unit IOU2 become different due to the parasitic resistances PR may be suppressed.

In contrast, in the example described with reference to FIG. 13, during the write operation, a resistance value of the parasitic resistances PR of the poly line PL, which is applied to an accessed memory cell in the first input and output unit IOU1, may be different from a resistance value of the parasitic resistances PR of the poly line PL, which is applied to an accessed memory cell in the second input and output unit IOU2. Accordingly, a result of the write operation of the first input and output unit IOU1 and a result of the write operation of the second input and output unit IOU2 may become different due to the parasitic resistances PR. That results of the write operations using the same voltages are different may mean that the reliability of the write operation is reduced.

Figure 14:
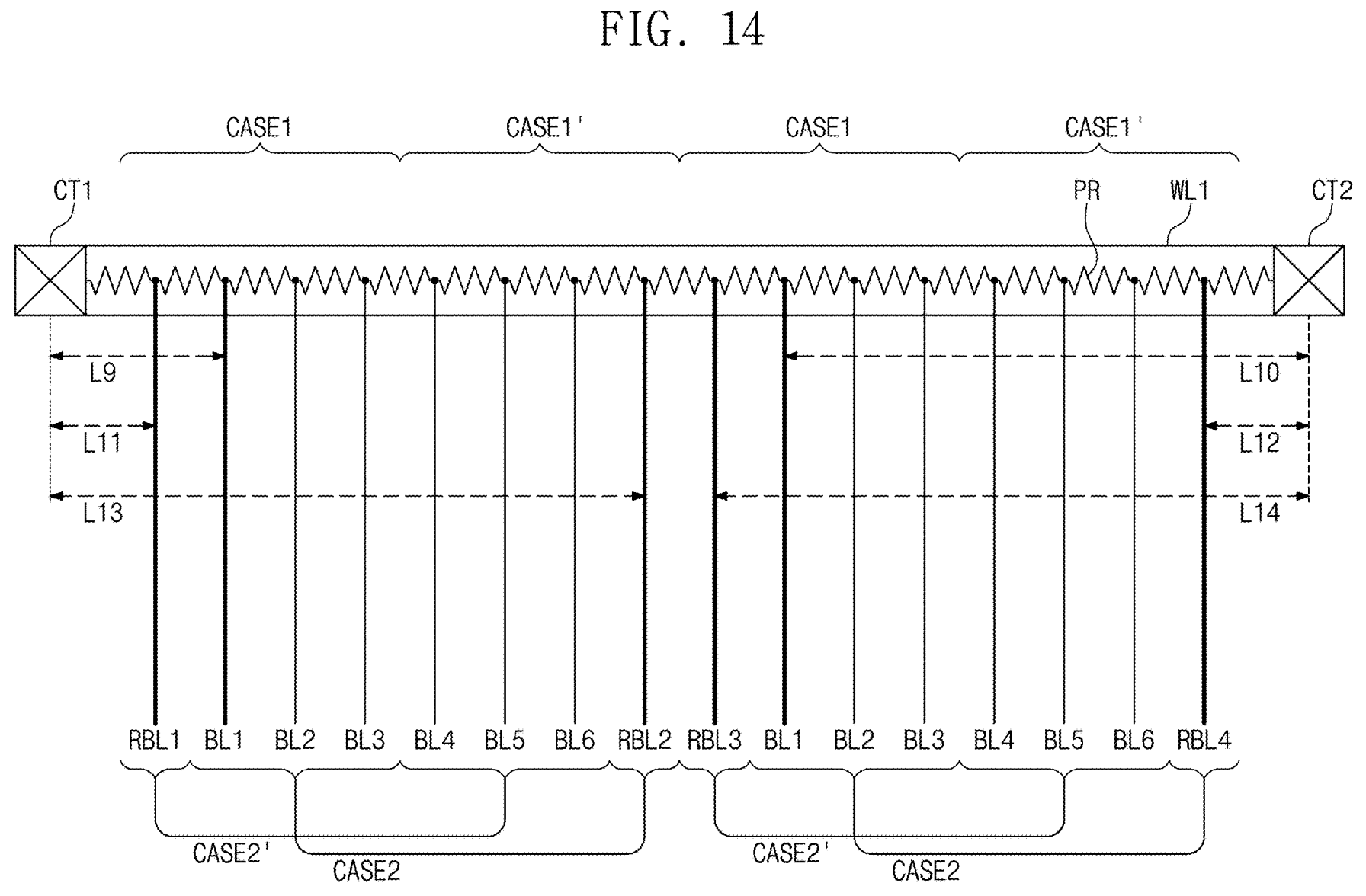

FIG. 14 illustrates an example in which the first bit line BL1 is selected for the read operation in the first input and output unit IOU1 and the second input and output unit IOU2.

Referring to FIG. 14, in a first case CASE1, the first reference bit line RBL1 may be selected for the read operation of the first to third bit lines BL1 to BL3 of the first input and output unit IOU1. Also, the third reference bit line RBL3 may be selected for the read operation of the first to third bit lines BL1 to BL3 of the second input and output unit IOU2.

In a first case CASE1', the second reference bit line RBL2 may be selected for the read operation of the fourth to sixth bit lines BL4 to BL6 of the first input and output unit IOU1. Also, the fourth reference bit line RBL4 may be selected for the read operation of the fourth to sixth bit lines BL4 to BL6 of the second input and output unit IOU2.

In the first case CASE1, in the first input and output unit IOU1, a distance from the first contact CT1 to the first bit line BL1 may be the ninth distance L9. In this case, two parasitic resistances PR may be effectively applied between the first contact CT1 and the first bit line BL1 of the first input and output unit IOU1. In the first input and output unit IOU1, a distance from the first contact CT1 to the first reference bit line RBL1 may be an eleventh distance L11. In this case, one parasitic resistance PR may be effectively applied between the first contact CT1 and the first reference bit line RBL1 of the first input and output unit IOU1.

In the first case CASE1, in the second input and output unit IOU2, a distance from the second contact CT2 to the first bit line BL1 may be the tenth distance L10. In this case, seven parasitic resistances PR may be effectively applied between the second contact CT2 and the first bit line BL1 of the second input and output unit IOU2. In the second input and output unit IOU2, a distance from the second contact CT2 to the third reference bit line RBL3 may be a fourteenth distance L14. In this case, eight parasitic resistances PR may be effectively applied between the second contact CT2 and the third reference bit line RBL3 of the second input and output unit IOU2.

In a second case CASE2, the second reference bit line RBL2 may be selected for the read operation of the first to third bit lines BL1 to BL3 of the first input and output unit IOU1. Also, the fourth reference bit line RBL4 may be selected for the read operation of the first to third bit lines BL1 to BL3 of the second input and output unit IOU2.

In a second case CASE2', the first reference bit line RBL1 may be selected for the read operation of the fourth to sixth bit lines BL4 to BL6 of the first input and output unit IOU1. Also, the third reference bit line RBL3 may be selected for the read operation of the fourth to sixth bit lines BL4 to BL6 of the second input and output unit IOU2.

In the second case CASE2, in the first input and output unit IOU1, a distance from the first contact CT1 to the first bit line BL1 may be the ninth distance L9. In this case, two parasitic resistances PR may be effectively applied between the first contact CT1 and the first bit line BL1 of the first input and output unit IOU1. Also, in the first input and output unit IOU1, a distance from the first contact CT1 to the second reference bit line RBL2 may be a thirteenth distance L13. In this case, eight parasitic resistances PR may be effectively applied between the first contact CT1 and the second reference bit line RBL2 of the first input and output unit IOU1.

In the second case CASE2, in the second input and output unit IOU2, a distance from the second contact CT2 to the first bit line BL1 may be the tenth distance L10. In this case, seven parasitic resistances PR may be effectively applied between the second contact CT2 and the first bit line BL1 of the second input and output unit IOU2. Also, in the second input and output unit IOU2, a distance from the second contact CT2 to the fourth reference bit line RBL4 may be the twelfth distance L12. In this case, one parasitic resistance PR may be effectively applied between the second contact CT2 and the fourth reference bit line RBL4 of the second input and output unit IOU2.

In the embodiment described with reference to FIG. 11, during the read operation, a distance between a to-be-accessed memory cell and the first contact CT1 in the first input and output unit IOU1 may be identical to a distance between a to-be-accessed memory cell and the second contact CT2 in the second input and output unit IOU2. Also, during the read operation, a distance between a to-be-accessed reference memory cell and the first contact CT1 in the first input and output unit IOU1 may be identical to a distance between a to-be-accessed reference memory cell and the second contact CT2 in the second input and output unit IOU2.

For example, in the embodiment described with reference to FIG. 11, the influence of the parasitic resistances PR applied to the read operation of the first input and output unit IOU1 may be identical to the influence of the parasitic resistances PR applied to the read operation of the second input and output unit IOU2. Accordingly, a phenomenon that a result of the read operation of the first input and output unit IOU1 and a result of the read operation of the second input and output unit IOU2 become different due to the parasitic resistances PR may be suppressed.

In contrast, in the example described with reference to FIG. 14, during the read operation, a resistance value of the parasitic resistances PR of the poly line PL, which is applied to an accessed memory cell in the first input and output unit IOU1, may be different from a resistance value of the parasitic resistances PR of the poly line PL, which is applied to an accessed memory cell in the second input and output unit IOU2. Also, during the read operation, a resistance value of the parasitic resistances PR of the poly line PL, which is applied to an accessed reference memory cell in the first input and output unit IOU1, may be different from a resistance value of the parasitic resistances PR of the poly line PL, which is applied to an accessed reference memory cell in the second input and output unit IOU2. Accordingly, a result of the read operation on the first input and output unit IOU1 and a result of the read operation on the second input and output unit IOU2 may become different due to the parasitic resistances PR. That results of the read operations using the same voltages are different may mean that the reliability of the read operation is reduced.

An embodiment of the present disclosure may prevent the reliability of the write operation and the read operation from being reduced by parasitic resistances of the poly line PL, by aligning and selecting the order (or ordering) of bit lines depending on the order or distance from the first contact CT1 and the second contact CT2.

Figure 15:
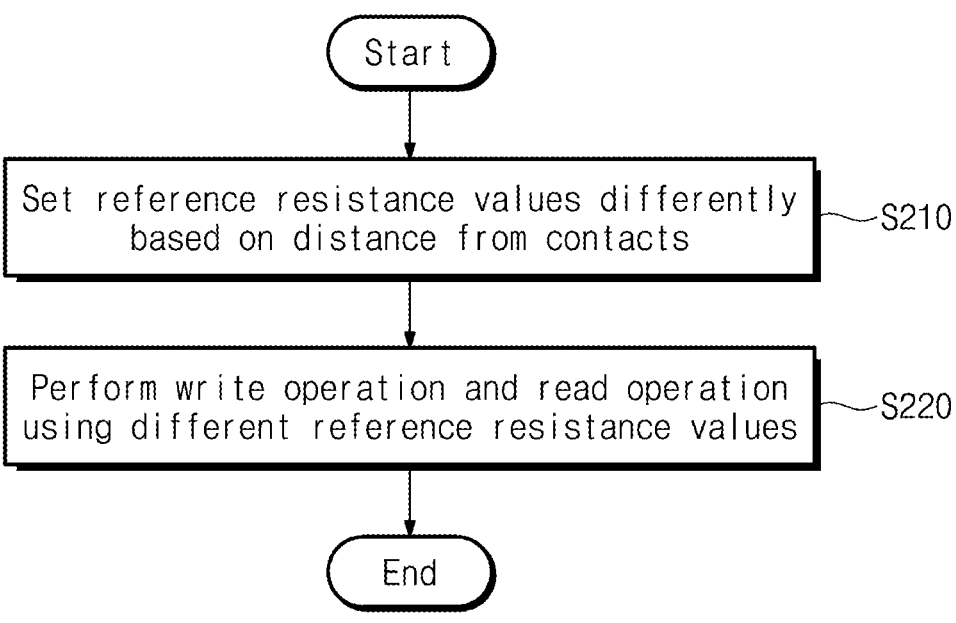
FIG. 15 illustrates an example of an operating method of a nonvolatile memory device according to another embodiment of the present disclosure.

FIG. 15 illustrates an example of an operating method of the nonvolatile memory device 100 according to an embodiment of the present disclosure. Referring to FIGS. 1, 5, 8, and 15, in operation S210, the nonvolatile memory device 100 may differently set reference resistance values of the reference memory cells RMC. For example, each of the reference resistance values may be set based on a distance from the first contact CT1 or the second contact CT2 to a corresponding reference memory cell RMC.

For example, the reference resistance elements RRE of the reference memory cells RMC may include variable resistance elements which are the same as the resistance elements RE of the memory cells MC. The nonvolatile memory device 100 may differently set resistance values of the reference resistance elements RRE by differently performing write operations of the reference resistance elements RRE of the reference memory cells RMC.

For example, a distance from the second reference bit line RBL2 to the first contact CT1 may be longer than a distance from the first reference bit line RBL1 to the first contact CT1. That is, the resistance value of the parasitic resistances PR applied to the second reference bit line RBL2 may be greater than the resistance value of the parasitic resistances PR applied to the first reference bit line RBL1. The nonvolatile memory device 100 may perform the write operation on the reference memory cells RMC such that a resistance value of the reference resistance elements RRE of the reference memory cells RMC connected to the second reference bit line RBL2 is smaller than a resistance value of the reference resistance elements RRE of the reference memory cells RMC connected to the first reference bit line RBL1.

Likewise, a distance from the third reference bit line RBL3 to the second contact CT2 may be longer than a distance from the fourth reference bit line RBL4 to the second contact CT2. That is, the resistance value of the parasitic resistances PR applied to the third reference bit line RBL3 may be greater than the resistance value of the parasitic resistances PR applied to the fourth reference bit line RBL4. The nonvolatile memory device 100 may perform the write operation on the reference memory cells RMC such that a resistance value of the reference resistance elements RRE of the reference memory cells RMC connected to the third reference bit line RBL3 is smaller than a resistance value of the reference resistance elements RRE of the reference memory cells RMC connected to the fourth reference bit line RBL4.

In operation S220, the nonvolatile memory device 100 may perform the write operation and the read operation by using different reference resistance values. The nonvolatile memory device 100 may suppress an error due to a difference between the parasitic resistances PR applied to the reference memory cells RMC, by differently setting reference resistance values of the reference memory cells RMC.

In an embodiment, the reference resistance element RRE may be a normal resistance element, not a variable resistance element. In this case, resistance elements with different reference resistance values may be provided to the reference memory cells RMC in the process of manufacturing the nonvolatile memory device 100.

Figure 16:
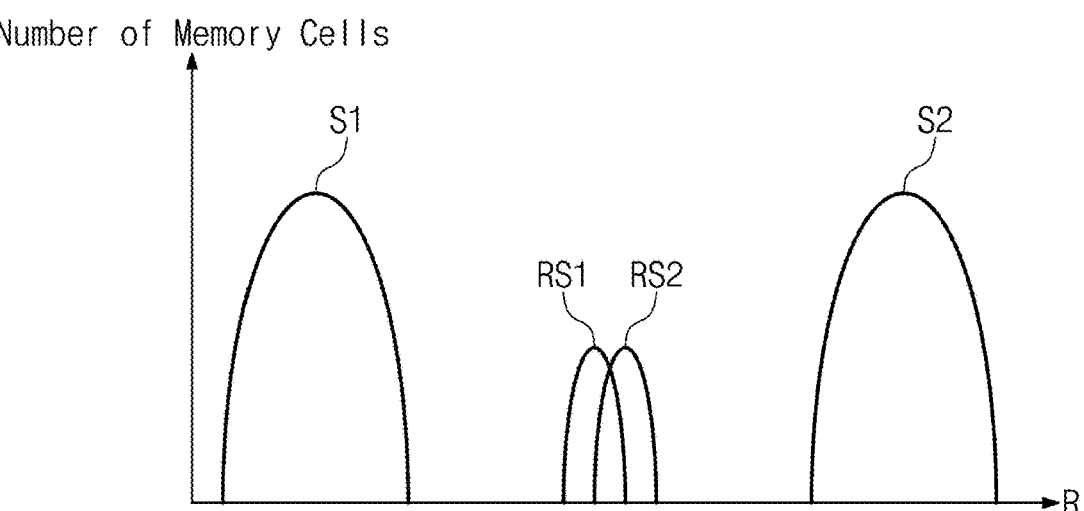
FIG. 16 illustrates an example in which reference resistances with different reference resistance values are used.

FIG. 16 illustrates an example in which reference resistances with different reference resistance values are used. In FIG. 16 the horizontal axis represents a resistance value "R", and the vertical axis represents the number of memory cells. Referring to FIGS. 5 and 16, each memory cell MC may have one of a first state S1 and a second state S2. Each of the first state S1 and the second state S2 may refer to a range of resistance values. Each reference memory cell RMC may have one of a first reference state RS1 and a second reference state RS2. Each of the first reference state RS1 and the second reference state RS2 may refer to a range of resistance values.

During the read operation or the write operation, the write driver and sense amplifier 130 may determine the memory cell MC whose resistance value is lower than the first reference state RS1 or the second reference state RS2, as having the first state S1. The write driver and sense amplifier 130 may determine the memory cell MC whose resistance value is higher than the first reference state RS1 or the second reference state RS2, as having the second state S2.

In an embodiment, the first reference state RS1 may refer to a state of the reference memory cell RMC connected to the second reference bit line RBL2 or the third reference bit line RBL3 distant from the first contact CT1 or the second contact CT2. The second reference state RS2 may refer to a state of the reference memory cell RMC connected to the first reference bit line RBL1 or the fourth reference bit line RBL4 close to the first contact CT1 or the second contact CT2.

When the read operation or the write operation is performed, the parasitic resistance PR which is greater than that of the reference memory cell RMC connected to the first reference bit line RBL1 or the fourth reference bit line RBL4 close to the first contact CT1 or the second contact CT2 may be applied to the reference memory cell RMC connected to the second reference bit line RBL2 or the third reference bit line RBL3 distant from the first contact CT1 or the second contact CT2. Accordingly, the first reference state RS1 and the second reference state RS2 may appear as having substantially close (or similar) resistance values. Accordingly, the margin of reliability may be improved.

Figure 17:
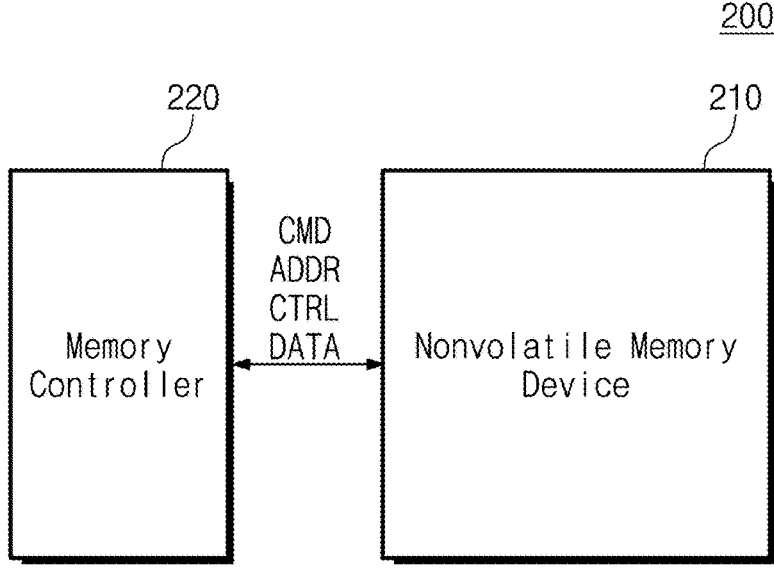
FIG. 17 illustrates a memory system according to an embodiment of the present disclosure.

FIG. 17 illustrates a memory system 200 according to an embodiment of the present disclosure. Referring to FIG. 17, the memory system 200 may include a nonvolatile memory device 210 and a memory controller 220.

The nonvolatile memory device 210 may include the nonvolatile memory device 100 described with reference to FIGS. 1 to 16. A word line of the nonvolatile memory device 210 may include the poly line PL, the metal line ML, and the contacts CT connecting the poly line PL and the metal line ML. The nonvolatile memory device 210 may select bit lines and source lines based on an order or a distance from the contacts CT in response to the same address. For example, the nonvolatile memory device 210 may select bit lines and source lines located at the same order or distance from the contacts CT.

The memory controller 220 may control the nonvolatile memory device 210. The memory controller 220 may provide the command CMD, the address ADDR, and the control signal CTRL to the nonvolatile memory device 210. The memory controller 220 may exchange data "DATA" with the nonvolatile memory device 210.

The memory controller 220 may perform the write operation or the read operation on the nonvolatile memory device 210 depending on a request from an external host device. For example, the memory controller 220 may control the nonvolatile memory device 210 such that resistance values of reference memory cells of the nonvolatile memory device 210 are differently set based on the distances from the contacts CT to the reference memory cells.

In an embodiment, the memory controller 220 may perform error correction encoding, encryption, and compression for the data "DATA" written in the nonvolatile memory device 210. Also, the memory controller 220 may perform error correction decoding, decryption, and decompression for the data "DATA" read from the nonvolatile memory device 210.

In an embodiment, the memory system 200 may be used as an auxiliary storage device which stores original data of an operating system and applications, and original data of user data. For example, the memory system 200 may be used as a solid state drive.

In an embodiment, the memory system 200 may be used as a main storage device of a computing device. For example, the memory system 200 may be used as a storage class memory (SCM). Alternatively, the memory system 200 may be used as an embedded buffer memory. For example, the memory controller 220 of the memory system 200 may be included in a processor such as a central processing unit, an application processor, a graphics processor, or a neural processor.

Figure 18:
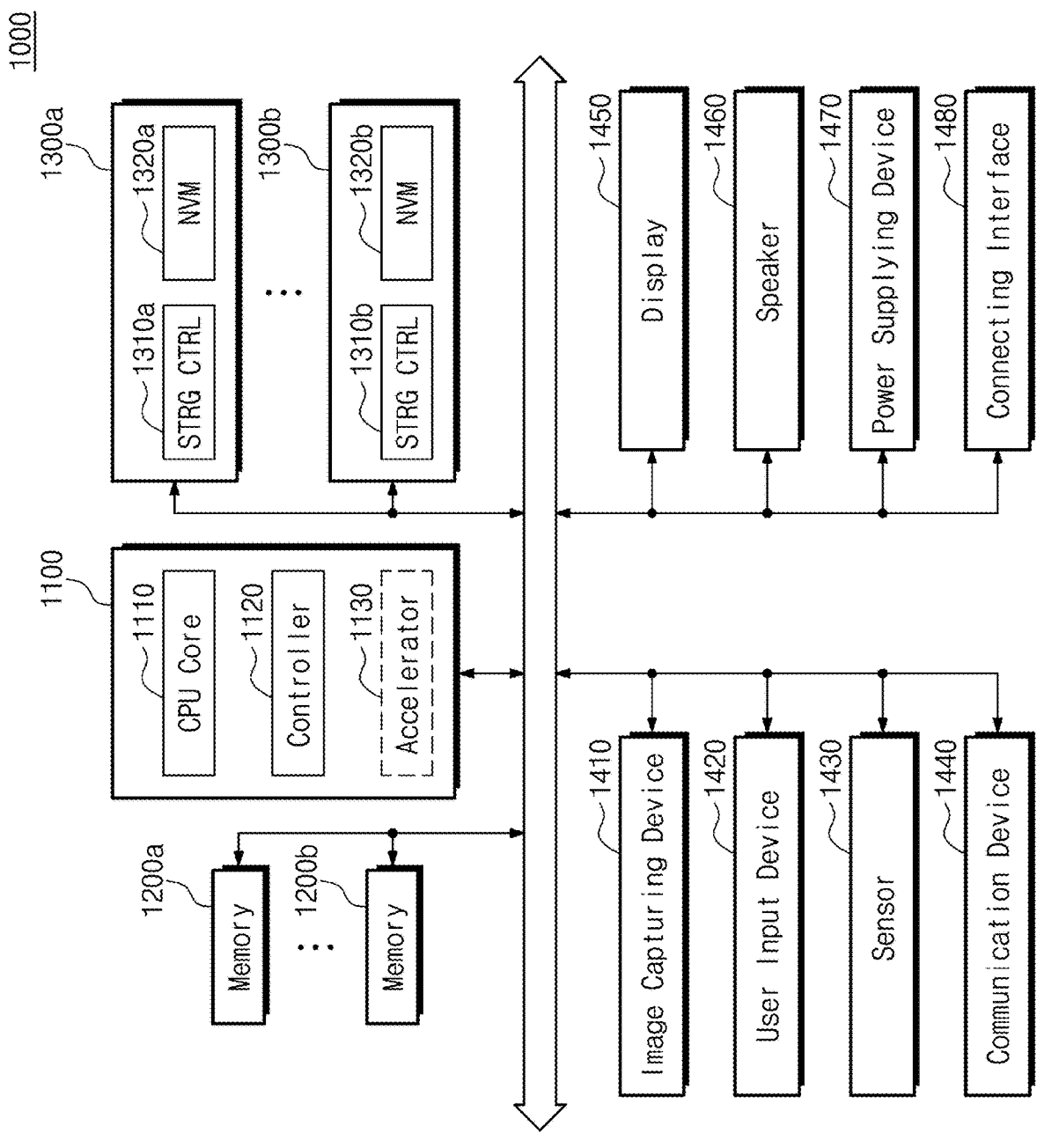
FIG. 18 is a diagram illustrating a system to which a storage device according to an embodiment of the present disclosure is applied.

FIG. 18 is a diagram of a system 1000 to which a storage device is applied, according to an embodiment. The system 1000 of FIG. 18 may basically be a mobile system, such as a portable communication terminal (e.g., a mobile phone), a smartphone, a tablet personal computer (PC), a wearable device, a healthcare device, or an Internet of things (IOT) device. However, the system 1000 of FIG. 18 is not necessarily limited to the mobile system and may be a PC, a laptop computer, a server, a media player, or an automotive device (e.g., a navigation device).

Referring to FIG. 18, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). Each of the memories 1200a and 1200b may include the nonvolatile memory device 100 described with reference to FIGS. 1 to 16. The memories 1200a and 1200b may be implemented in the same package as the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and NVMs (Non-Volatile Memories) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM. Each of the NVMs 1320a and 1320b may include the nonvolatile memory device 100 described with reference to FIGS. 1 to 16.

The storage devices 1300a and 1300b may be physically separated from the main processor 1100 and included in the system 1000 or implemented in the same package as the main processor 1100. In addition, the storage devices 1300a and 1300b may have types of solid-state devices (SSDs) or memory cards and be removably combined with other components of the system 1000 through an interface, such as the connecting interface 1480 that will be described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

In the above embodiments, components according to the present disclosure are described by using the terms "first", "second", "third", etc. However, the terms "first", "second", "third", etc. may be used to distinguish components from each other and do not limit the present disclosure. For example, the terms "first", "second", "third", etc. do not involve an order or a numerical meaning of any form.

In the above embodiments, components according to embodiments of the present disclosure are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

According to embodiments of the present disclosure, resistance values of parasitic resistances between a bit line or source line and reference memory cells may become uniform. Accordingly, a nonvolatile memory device with improved write and read reliability, an operating method of the nonvolatile memory device, and a storage device including nonvolatile memory device are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory device comprising:

a memory cell array; and a write driver and sense amplifier connected to the memory cell array through bit lines, wherein the memory cell array includes:

a first cell area including a plurality of first memory cells arranged on a plane corresponding to a first direction and a second direction perpendicular to the first direction;

a second cell area including a plurality of second memory cells arranged on the plane so as to be disposed on one side of the first cell area in the first direction;

a word line extending in the first direction and connected to the plurality of first memory cells and the plurality of second memory cells;

first bit lines extending in the second direction and respectively connected to the plurality of first memory cells; and second bit lines extending in the second direction and respectively connected to the plurality of second memory cells, wherein the word line includes:

a poly line extending in the first direction on the plane;

a metal line disposed over the poly line and extending in the first direction;

a first contact disposed on one side of the first cell area in a direction facing away from the first direction and connecting the poly line and the metal line along a third direction perpendicular to the first direction and the second direction; and a second contact disposed on one side of the second cell area in the first direction and connecting the poly line and the metal line along the third direction, and wherein the write driver and sense amplifier is configured to:

receive a column address, and in response to the column address, select a k-th first bit line, k being a positive integer, from the first contact from among the first bit lines and select a k-th second bit line from the second contact from among the second bit lines.

2. The memory device of claim 1, further comprising:

a row decoder connected to the word line, wherein the write driver and sense amplifier and the row decoder are configured to perform a write operation on a first memory cell connected to the k-th first bit line from among the plurality of first memory cells and a second memory cell connected to the k-th second bit line from among the plurality of second memory cells.

3. The memory device of claim 1, further comprising:

a row decoder connected to the word line, wherein the write driver and sense amplifier and the row decoder are configured to perform a read operation on a first memory cell connected to the k-th first bit line from among the plurality of first memory cells and a second memory cell connected to the k-th second bit line from among the plurality of second memory cells.

4. The memory device of claim 3, wherein the write driver and sense amplifier is configured to simultaneously output a result of the read operation on the first memory cell connected to the k-th first bit line and a result of the read operation on the second memory cell connected to the k-th second bit line.

5. The memory device of claim 3, wherein the memory cell array further includes:

a first reference cell area between the first contact and the first cell area and including a first reference memory cell connected to the word line;

a second reference cell area between the first cell area and the second cell area and including a second reference memory cell connected to the word line;

a first reference bit line connected to the write driver and sense amplifier and the first reference memory cell; and a second reference bit line connected to the write driver and sense amplifier and the second reference memory cell.

6. The memory device of claim 5, wherein the write driver and sense amplifier and the row decoder are configured to perform:

a read operation on first memory cells, which are connected to first bit lines close to the first contact from among the first bit lines, from among the plurality of first memory cells by using the first reference memory cell, and a read operation on first memory cells, which are connected to first bit lines close to the second cell area from among the first bit lines, from among the plurality of first memory cells by using the second reference memory cell.

7. The memory device of claim 5, wherein the write driver and sense amplifier and the row decoder are configured to perform:

a read operation on first memory cells, which are connected to first bit lines close to the first contact from among the first bit lines, from among the plurality of first memory cells by using the second reference memory cell, and a read operation on first memory cells, which are connected to first bit lines close to the second cell area from among the first bit lines, from among the plurality of first memory cells by using the first reference memory cell.

8. The memory device of claim 5, wherein the memory cell array further includes:

a third reference cell area between the first reference cell area and the second cell area and including a third reference memory cell connected to the word line;

a fourth reference cell area between the second contact and the second cell area and including a fourth reference memory cell connected to the word line;

a third reference bit line connected to the write driver and sense amplifier and the third reference memory cell; and a fourth reference bit line connected to the write driver and sense amplifier and the fourth reference memory cell.

9. The memory device of claim 8, wherein the memory cell array further includes:

a first dummy cell area between the second contact and the fourth reference cell area and including a first dummy memory cell connected to the word line; and a second dummy cell area on one side of the second contact in the first direction and including a second dummy memory cell connected to the word line.

10. The memory device of claim 5, wherein the memory cell array further includes:

a first dummy cell area between the first contact and the first reference cell area and including a first dummy memory cell connected to the word line; and a second dummy cell area on one side of the first contact in a direction facing away from the first direction and including a second dummy memory cell connected to the word line.

11. The memory device of claim 5, wherein the first reference memory cell includes a first selection transistor and a first reference resistance element connected to each other, wherein the second reference memory cell includes a second selection transistor and a second reference resistance element connected to each other, and wherein a resistance value of the poly line connected to the first selection transistor between the first contact and the first reference bit line is smaller than a resistance value of the poly line connected to the second selection transistor between the first contact and the second reference bit line.

12. The memory device of claim 1, wherein the memory cell array further includes:

a third cell area including a plurality of third memory cells connected to the word line and arranged on the plane so as to be disposed on one side of the second cell area in the first direction;

a fourth cell area including a plurality of fourth memory cells connected to the word line and arranged on the plane so as to be disposed on one side of the third cell area in the first direction;

third bit lines extending in the second direction and connected to the write driver and sense amplifier and the plurality of third memory cells; and fourth bit lines extending in the second direction and connected to the write driver and sense amplifier and the plurality of fourth memory cells.

13. The memory device of claim 12, wherein the word line further includes a third contact connecting the poly line and the metal line on one side of the fourth cell area in the first direction.

14. The memory device of claim 13, wherein the write driver and sense amplifier is further configured to:

in response to the column address, select a k-th third bit line from the second contact from among the third bit lines and select a k-th fourth bit line from the third contact from among the fourth bit lines.

15. An operating method of a memory device which includes a word line including a poly line, a metal line, a first contact and a second contact connecting the poly line and the metal line, and first bit lines and second bit lines between the first contact and the second contact, the method comprising:

receiving a column address; and in response to the column address, selecting a first bit line among the first bit lines and a second bit line among the second bit lines, based on an order from the first contact and an order from the second contact, wherein the order of the selected first bit line from the first contact is the same as the order of the selected second bit line from the second contact.

16. The method of claim 15, wherein the selecting of the first and second bit lines includes:

selecting a k-th first bit line, k being a natural number equal to or greater than 1, from the first contact from among the first bit lines, and selecting a k-th second bit line from the second contact from among the second bit lines.

17. The method of claim 15, further comprising:

performing a write operation or a read operation simultaneously on a first memory cell connected to the selected first bit line and a second memory cell connected to the selected second bit line.

18. The method of claim 15, further comprising:

setting a resistance value of a first reference memory cell connected to a first reference bit line between the first contact and the first bit lines to a first resistance value; and setting a resistance value of a second reference memory cell connected to a second reference bit line between the first bit lines and the second bit lines to a second resistance value different from the first resistance value.

19. The method of claim 18, wherein the first resistance value is smaller than the second resistance value.

20. A memory system comprising:

a nonvolatile memory device; and a memory controller configured to control the nonvolatile memory device, wherein the nonvolatile memory device includes:

a word line including a poly line, a metal line, and a first contact and a second contact connecting the poly line and the metal line;

first bit lines and second bit lines between the first contact and the second contact;

memory cells connected to the word line, the first bit lines, and the second bit lines; and a write driver and sense amplifier configured to:

receive a column address from the memory controller, and in response to the column address, select a first bit line among the first bit lines and a second bit line among the second bit lines based on an order from the first contact and an order from the second contact, wherein the order of the selected first bit line from the first contact is the same as the order of the selected second bit line from the second contact.

* * * * *